United States Patent
Lu et al.

(10) Patent No.: US 10,969,618 B1
(45) Date of Patent: Apr. 6, 2021

(54) OPPOSITE SUBSTRATE

(71) Applicant: Au Optronics Corporation, Hsinchu (TW)

(72) Inventors: Ssu-Hui Lu, Hsinchu (TW); Jia-Hong Ye, Hsinchu (TW); Kuo-Yu Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/856,050

(22) Filed: Apr. 23, 2020

(30) Foreign Application Priority Data

Nov. 8, 2019 (TW) ................................ 108140714

(51) Int. Cl.
*G02F 1/1333* (2006.01)
*G02F 1/1335* (2006.01)
*G02F 1/1362* (2006.01)
*G06F 3/041* (2006.01)

(52) U.S. Cl.
CPC .... *G02F 1/133512* (2013.01); *G02F 1/13338* (2013.01); *G06F 3/041* (2013.01); *G02F 1/133357* (2021.01); *G02F 1/133514* (2013.01); *G02F 1/136286* (2013.01); *G06F 2203/04103* (2013.01); *G06F 2203/04107* (2013.01)

(58) Field of Classification Search
CPC ............ G02F 1/13338; G02F 1/13394; G02F 1/136209; G02F 1/133357; G02F 1/133514; G02F 1/133512; G06F 3/041
See application file for complete search history.

(56) References Cited

U.S. PATENT DOCUMENTS

| 6,022,646 | A | 2/2000 | Kim et al. |
| 7,050,130 | B2 | 5/2006 | Sohn et al. |
| 10,564,333 | B2 | 2/2020 | Li et al. |
| 2016/0103353 | A1* | 4/2016 | Kim ................ G02F 1/13394 349/42 |

(Continued)

FOREIGN PATENT DOCUMENTS

| CN | 104238814 | 12/2014 |
| CN | 104483776 | 4/2015 |

(Continued)

*Primary Examiner* — Xuemei Zheng
(74) *Attorney, Agent, or Firm* — JCIPRNET

(57) ABSTRACT

An opposite substrate including a substrate, first light-shielding patterns, second light-shielding patterns, a planarization layer and support members is provided. The support members are located in primary support regions and secondary support regions of the opposite substrate. The first light-shielding patterns respectively extend along a first direction, and a material of the first light-shielding patterns includes an organic material. The second light-shielding patterns respectively extend along a second direction, and a material of the second light-shielding patterns includes metal. The first light-shielding patterns and the second light-shielding patterns are respectively located at opposite sides of the planarization layer. Alternatively, the first light-shielding patterns and the second light-shielding patterns are located at the same side of the planarization layer, and the planarization layer has openings respectively overlapped with the support members located in the secondary support regions.

15 Claims, 20 Drawing Sheets

(56) References Cited

U.S. PATENT DOCUMENTS

| | | |
|---|---|---|
| 2016/0252766 A1 | 9/2016 | Liu et al. |
| 2016/0356930 A1 | 12/2016 | Li et al. |
| 2017/0192322 A1* | 7/2017 | Jung ................. G02F 1/133345 |
| 2018/0107051 A1* | 4/2018 | Hu ......................... G02B 5/201 |

FOREIGN PATENT DOCUMENTS

| | | |
|---|---|---|
| CN | 205539834 | 8/2016 |
| JP | 2014145924 | 8/2014 |
| KR | 100978251 | 8/2010 |
| TW | I667522 | 8/2019 |

\* cited by examiner

OPPOSITE SUBSTRATE

CROSS-REFERENCE TO RELATED APPLICATION

This application claims the priority benefit of Taiwan patent application serial no. 108140714, filed on Nov. 8, 2019. The entirety of the above-mentioned patent application is hereby incorporated by reference here and made a part of this specification.

BACKGROUND

Technical Field

The disclosure relates to an opposite substrate and particularly relates to an opposite substrate adapted to a display.

Description of Related Art

Along with development of science and technology, a demand for high-resolution displays is increasing. For instance, in a head-mounted display (HMD), a lens group is adopted to project display images into human eyes, so that a user may see enlarged virtual images. In order to achieve immersion of virtual reality (VR) and improve fineness of images, a resolution of the HMD is required to be or exceed 1000 PPI (pixel per inch). However, subject to a current manufacturing technology, manufacturing limits, and material characteristics, light-shielding patterns of the opposite substrate in the display may be poorly produced as the resolution increases, which may result in problems such as insufficient light-shielding ability, light mixture, insufficient aperture ratio, etc.

SUMMARY

The disclosure is directed to an opposite substrate, which is capable of mitigating problems of insufficient light-shielding ability, light mixture, insufficient aperture ratio, etc.

The disclosure provides an opposite substrate adapted to a display. The opposite substrate includes a substrate, a plurality of first light-shielding patterns, a plurality of second light-shielding patterns, a planarization layer, and a plurality of support members. The first light-shielding patterns are located on the substrate and respectively extend along a first direction, wherein a material of the first light-shielding patterns includes an organic material. The second light-shielding patterns are located on the substrate and are intersected with the first light-shielding patterns. The second light-shielding patterns respectively extend along a second direction, and a material of the second light-shielding patterns includes metal. The planarization layer is overlapped with the first light-shielding patterns and the second light-shielding patterns. The first light-shielding patterns and the second light-shielding patterns are respectively located at opposite sides of the planarization layer or located at the same side of the planarization layer. The support members are located in a plurality of primary support regions and a plurality of secondary support regions of the opposite substrate. When the first light-shielding patterns and the second light-shielding patterns are located at the same side of the planarization layer, the planarization layer has a plurality of openings respectively overlapped with the support members located in the secondary support regions.

In an embodiment of the disclosure, the support members have the same thickness.

In an embodiment of the disclosure, the metal is low reflective metal.

In an embodiment of the disclosure, the first light-shielding patterns are disposed corresponding to a plurality of scan lines in an active device array substrate of the display, and the second light-shielding patterns are disposed corresponding to a plurality of data lines in the active device array substrate.

In an embodiment of the disclosure, the first light-shielding patterns are located between the planarization layer and the substrate. The planarization layer is located between the support members and the first light-shielding patterns. The support members are located between the second light-shielding patterns and the planarization layer.

In an embodiment of the disclosure, the first light-shielding patterns are overlapped with the support members located in the primary support regions and the secondary support regions. The second light-shielding patterns are overlapped with the support members located in the primary support regions, and the second light-shielding patterns are located outside the support members located in the secondary support regions.

In an embodiment of the disclosure, the second light-shielding patterns are overlapped with the support members located in the primary support regions and the secondary support regions. The first light-shielding patterns are overlapped with the support members located in the primary support regions, and the first light-shielding patterns are located outside the support members located in the secondary support regions.

In an embodiment of the disclosure, the first light-shielding patterns are overlapped with the support members located in the primary support regions and the secondary support regions. The planarization layer has the openings respectively overlapped with the support members located in the secondary support regions. The second light-shielding patterns are located outside the support members located in the primary support regions and the secondary support regions.

In an embodiment of the disclosure, the second light-shielding patterns are located between the first light-shielding patterns and the substrate. The first light-shielding patterns are located between the planarization layer and the second light-shielding patterns. The planarization layer is located between the support members and the first light-shielding patterns.

In an embodiment of the disclosure, the second light-shielding patterns are overlapped with the support members located in the primary support regions and the secondary support regions. The first light-shielding patterns are overlapped with the support members located in the primary support regions and the secondary support regions.

In an embodiment of the disclosure, the second light-shielding patterns are located outside the support members located in the primary support regions and the secondary support regions. The first light-shielding patterns are overlapped with the support members located in the primary support regions and the secondary support regions.

In an embodiment of the disclosure, the opposite substrate further includes a color filter pattern layer. The color filter pattern layer is located between the first light-shielding patterns and the planarization layer. When the planarization layer has the openings respectively overlapped with the support members located in the secondary support regions, the support members located in the secondary support regions are disposed on the color filter pattern layer overlapped with the openings.

In an embodiment of the disclosure, the opposite substrate further includes a plurality of touch electrodes. The touch electrodes are disposed on the first light-shielding patterns and intersected with the second light-shielding patterns.

In an embodiment of the disclosure, the first light-shielding patterns are disposed between the touch electrodes and the second light-shielding patterns.

In an embodiment of the disclosure, the planarization layer is disposed between the touch electrodes and the second light-shielding patterns.

Based on the above descriptions, in one or more embodiments of the disclosure, the second light-shielding patterns in the opposite substrate are applied to shield components (such as the data lines of the active device array substrate in the display) in the display which are not intended to be seen by users, and the first light-shielding patterns and the second light-shielding patterns extending in different directions are formed on the substrate in batches and are intersected with each other. Therefore, in comparison with shielding light by only stacking color resists, the opposite substrate provided in one or more embodiments of the disclosure has better light-shielding ability and is adapted to mitigate the problem of light mixture. In addition, the opposite substrate provided in one or more embodiments of the disclosure is adapted to avoid the problem of insufficient aperture ratio caused by exposure at an edge corner of a photomask. Moreover, when the first light-shielding patterns and the second light-shielding patterns are located on the opposite sides of the planarization layer, the openings of the planarization layer in the secondary support regions may lead to height differences between the primary support regions and the secondary support regions. As such, the support members located on the primary support regions and the secondary support regions may be support members with the same thickness.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
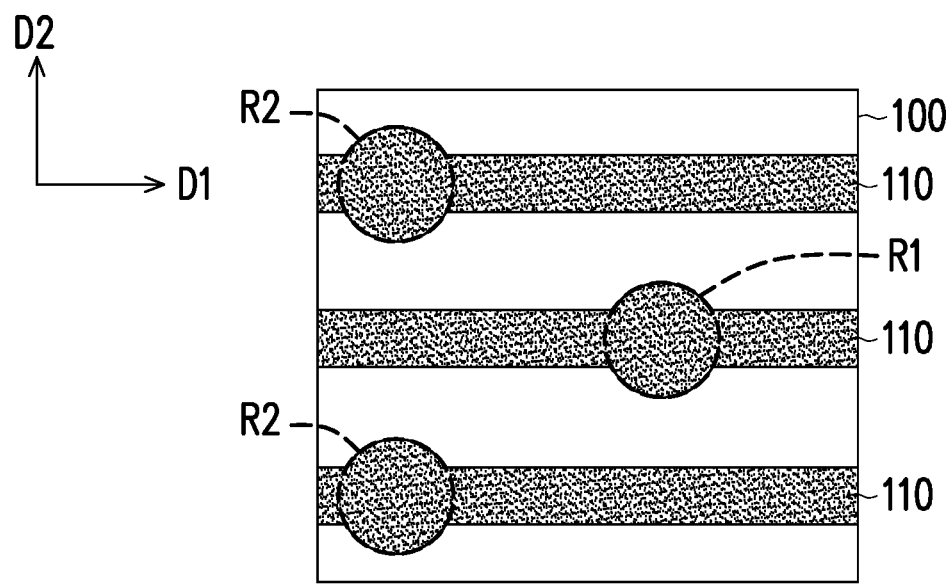
FIG. 1A to FIG. 1E are schematic partial top views of a manufacturing process of an opposite substrate according to a first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Directional terminology used in the embodiments, such as "top", "bottom", "front", "back", "left", "right", etc., is used with reference to the orientation of the figure(s) being described and are not intended to be limiting of the disclosure. In the drawings, general characteristics of methods, structures, and/or materials used in specific embodiments are illustrated. However, these drawings should not be construed to define or limit a scope or nature covered by these embodiments. For example, for simplicity's sake, a relative size, thickness, and location of each film layer, region, and/or structure may be reduced or enlarged. It will be understood that when a component such as a layer, a film, a region, or a substrate is referred to be "on" or "connected to" another component, it may be directly on or connected to the other another component, or intermediate components may also exist there between. Comparatively, when a component is referred to be "directly on" or "directly connected" to another, none other intermediate component exits there between. As used herein, the "connection" may refer to physical and/or electrical connection. Furthermore, "electrical connection" or "coupling" of two components may refer to that other components may exist between the two components.

In a plurality of embodiments listed in the disclosure, the same or similar components be denoted by the same or similar reference numerals, and descriptions thereof will be omitted. In addition, the features in different embodiments may be combined with each other in case of no confliction, and simple equivalent changes and modifications made according to the specification or a scope of the patent application are still within a protection scope of the patent. Moreover, the terms "first" and "second" mentioned in the specification or the scope of the patent application are only used to name discrete components or to distinguish different embodiments or ranges, but are not used to limit an upper limit or a lower limit of an amount of the components, and are also not used to limit a manufacturing sequence or a setting sequence of the components.

"About", "approximate", or "substantial" used in the specification includes a stated value and an average value within an acceptable deviation range from a specific value determined by those with ordinary skills in the art while considering the discussed measurement and a specific number of errors associated with the measurement (i.e. limits of a measurement system). For example, "about" may represent to be within one or more standard deviations of the stated value, or within ±30%, ±20%, ±10%, and ±5%. Moreover, an acceptable deviation range or standard deviation may be selected for the "about", "approximate" or "substantial" used in the specification based on optical properties, etching properties, or other properties without using one standard deviation for all properties.

In the following embodiments, the opposite substrate is suitable for a display. Taking a liquid crystal display as an example, the opposite substrate may be combined with an active device array substrate, and a liquid crystal layer may be formed between the opposite substrate and the active device array substrate to provide display images. The known technologies may be referred for related descriptions of the active device array substrate and the liquid crystal layer, and no more restrictions are added.

FIG. 1A to FIG. 1E are schematic partial top views of a manufacturing process of an opposite substrate according to a first embodiment of the disclosure. FIG. 2 is a schematic cross-sectional view along a section line I-I' in FIG. 1E.

Figure 2:
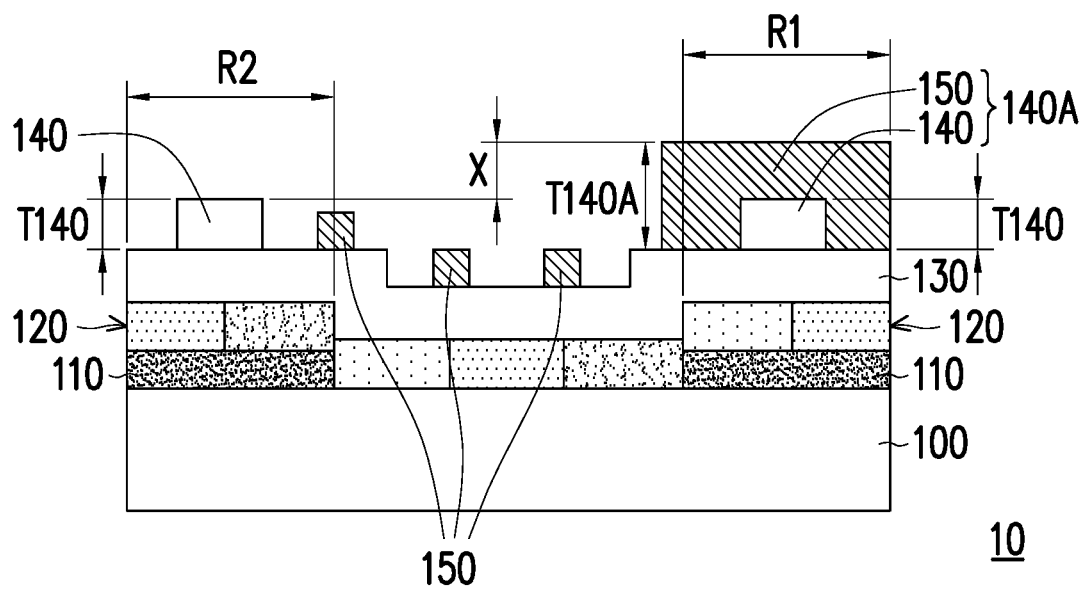
FIG. 2 is a schematic cross-sectional view along a section line I-I' in FIG. 1E.

With reference to FIG. 1A and FIG. 2, a plurality of first light-shielding patterns 110 are formed on a substrate 100. The first light-shielding patterns 110 respectively extend along a first direction D1, and the first light-shielding patterns 110 are arranged at intervals along a second direction D2. The first direction D1 is intersected with the second direction D2. For example, the first direction D1 and the second direction D2 are perpendicular to each other, but the disclosure is not limited thereto.

The first light-shielding patterns 110 may serve to shield components and/or film layers in the display that are not intended to be seen by a user. For example, the first light-shielding patterns 110 may be designed to shield components such as a plurality of scan lines and a plurality of active devices in an active device array substrate (not shown) of a display (not shown). Since areas occupied by the scan lines and the active devices are relatively large, the first light-shielding patterns 110 may be made of an organic material. The organic material may include black resin, but the disclosure is not limited thereto.

In the embodiment, the first light-shielding patterns 110 may also serve to shield light leakage. In detail, in a conventional liquid crystal display, the opposite substrate is usually configured with a plurality of primary support members with a greater thickness to maintain a liquid crystal cell gap between the opposite substrate and the active device array substrate, and the opposite substrate is configured with a plurality of secondary support members with a smaller thickness, where the secondary support members do not contact the active device array substrate when the liquid crystal display is not pressed, but contacts the active device array substrate when the liquid crystal display is pressed, so as to provide proper support. When the liquid crystal display is pressed, the primary support members and the secondary support members may probably be displaced to cause light leakage in regions where the primary support members are located (which are referred to as primary support regions hereinafter) and regions where the secondary support members are located (which are referred to as secondary support regions hereinafter). Moreover, the primary support members and the secondary support members may probably affect arrangement (a tilting direction and angle) of nearby liquid crystal molecules to cause light leakage. In the embodiment, the first light-shielding patterns 110 may serve to cover a plurality of primary support regions R1 (only one primary support region is schematically shown in FIG. 1A) and a plurality of secondary support regions R2, for example, to completely cover the primary support regions R1 and the secondary support regions R2, so as to better shield the light leakage caused by factors such as displacement of the support members and poor tilting direction and/or angle of the liquid crystal molecules.

Figure 1B:
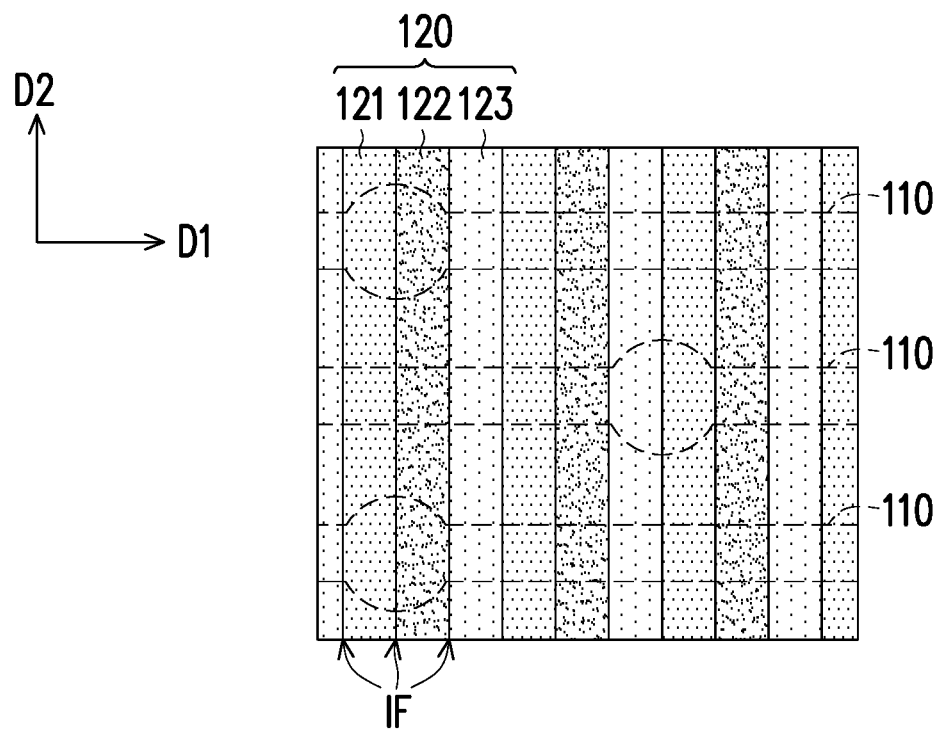
Figure 1C:
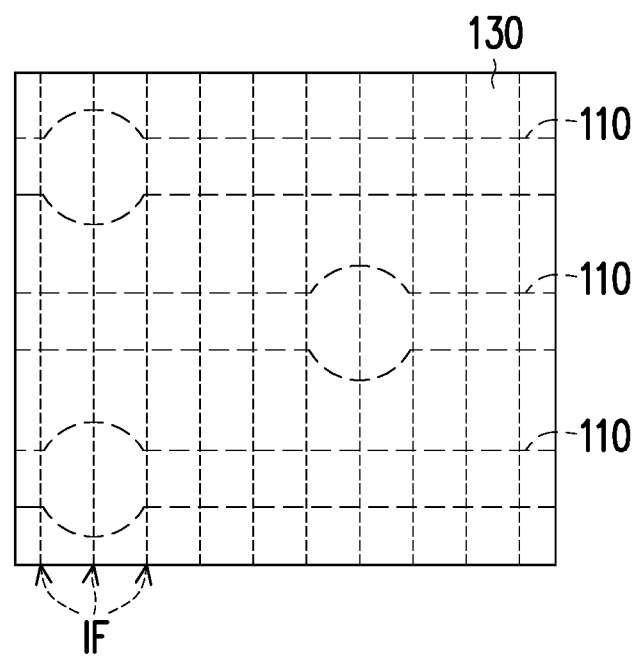
Figure 1D:
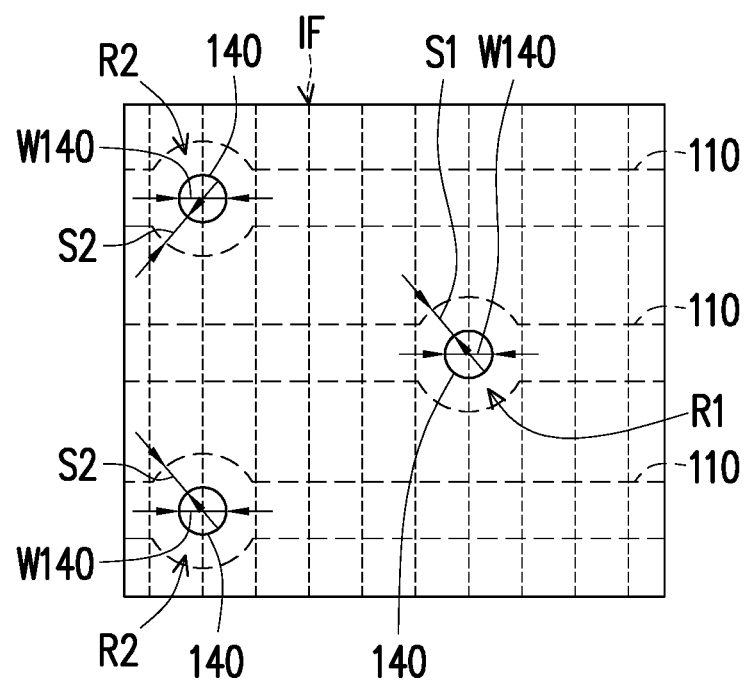

With reference to FIG. 1D, an area of the primary support region R1 may be designed to be larger than an area of a support member 140 located in the primary support region R1, and an edge of the primary support region R1 and an edge of the support member 140 maintain a distance S1. A magnitude of the distance S1 depends on a range and/or extent of the light leakage. On the other hand, an area of the secondary support region R2 may be designed to be larger than the area of the support member 140 located in the secondary support region R2, and an edge of the secondary support region R2 and the edge of the support member 140 maintain a distance S2. A magnitude of the distance S2 may depend on a range and/or extent of the light leakage.

With reference to FIG. 1B and FIG. 2, a color filter pattern layer 120 is formed on the substrate 100 and the first light-shielding patterns 110. The color filter pattern layer 120 allows a light beam with a specific wavelength to pass through and filters light beams with wavelengths other than the specific wavelength, so that the display may provide color images.

In the embodiment, the color filter pattern layer 120 includes a plurality of first filter patterns 121, a plurality of second filter patterns 122, and a plurality of third filter patterns 123. The filter patterns are alternately arranged along the first direction D1, and the filter patterns respectively extend along the second direction D2. Any two adjacent filter patterns may be overlapped or not overlapped at an interface IF between the two filter patterns (a situation of non-overlap is illustrated in FIG. 2). The first filter pattern 121 is, for example, a red filter pattern that allows a red light beam to pass through and filters (absorbs) light beams of other colors. The second filter pattern 122 is, for example, a green filter pattern that allows a green light beam to pass through and filters light beams of other colors. The third filter pattern 123 is, for example, a blue filter pattern that allows a blue light beam to pass through and filters light beams of other colors. However, color types and a number of colors of the filter patterns, and relative setting relationships between the filter patterns in the color filter pattern layer 120 are not limited as that shown in FIG. 1B.

Moreover, when a color filter pattern layer is formed on the active device array substrate of the display, the manufacturing process of the opposite substrate may omit the step of FIG. 1B. Namely, the opposite substrate may not include the color filter pattern layer 120.

With reference to FIG. 1C and FIG. 2, a planarization layer 130 is formed on the color filter pattern layer 120. In the embodiment, the planarization layer 130 is a continuous film layer, and the planarization layer 130 completely covers the color filter pattern layer 120. In addition to protecting the color filter pattern layer 120 (for example, to prevent the color filter pattern layer 120 from being deteriorated by moisture), the planarization layer 130 may also provide a relatively flat surface to facilitate configuring subsequent film layers and/or components (such as a plurality of the support members 140 shown in FIG. 1D). However, the planarization layer 130 is not limited to providing a full plane, and the planarization layer 130 may generally have rough and/or non-linear characteristics.

With reference to FIG. 1D and FIG. 2, a plurality of the support members 140 are formed on the planarization layer 130. The support members 140 are located in the primary support regions R1 and the secondary support regions R2 of the opposite substrate. In the embodiment, each of the primary support regions R1 is configured with one support member 140, and each of the secondary support regions R2 is configured with one support member 140. Moreover, as shown in FIG. 1D, the support members 140 may have a same width W140. In other words, the support member 140 located in the primary support region R1 and the support member 140 located in the secondary support region R2 may have the same width W140. Moreover, as shown in FIG. 2, the support members 140 may have a same thickness T140. In other words, the support member 140 located in the primary support region R1 and the support member 140 located in the secondary support region R2 may have the same thickness T140.

Figure 1E:
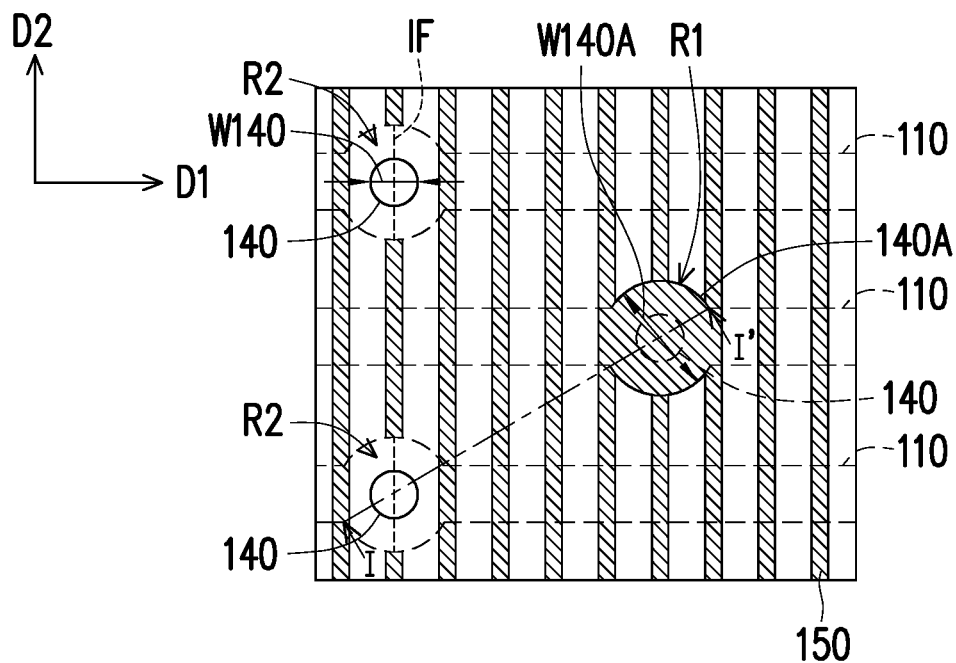

With reference to FIG. 1E and FIG. 2, a plurality of second light-shielding patterns 150 are formed on the planarization layer 130. The second light-shielding patterns 150 respectively extend along the second direction, and the second light-shielding patterns 150 are arranged at intervals along the first direction D1.

The second light-shielding patterns 150 may serve to shield components and/or film layers in the display that are not intended to be seen by the user. For example, the second light-shielding patterns 150 may be designed to shield a plurality of data lines (corresponding to the interface IF between any two adjacent filter patterns) in the active device array substrate of the display. Since areas occupied by the data lines are relatively small, the second light-shielding patterns 150 may be made of metal, so as to achieve better process accuracy. The metal is, for example, low reflective metal. The low reflective metal may include metal, metal oxide, and a stacked layer of the above two materials. In other words, the second light-shielding patterns 150 may be a single layer or a stacked multi-layer. For example, the low reflective metal may include chrome metal, chrome metal oxide, and a stacked layer of the above two materials, but the disclosure is not limited thereto.

In the embodiment, the second light-shielding patterns 150 may also lead to height differences X between the primary support regions R1 and the secondary support regions R2. In detail, as shown in FIG. 2, under the framework that the primary support region R1 and the secondary support region R2 are all configured with the first light-shielding patterns 110, the color filter pattern layer 120, the planarization layer 130 and the support members 140, and the support member 140 located in the primary support region R1 and the support member 140 located in the secondary support region R2 have the same thickness T140, the height difference X between the primary support region R1 and the secondary support region R2 may be formed by forming the second light-shielding pattern 150 in the primary support region R1 and not forming the second light-shielding pattern 150 in the secondary support region R2. Under such design, the second light-shielding patterns 150 are overlapped with the support members 140 located in the primary support regions R1, the second light-shielding patterns 150 are located outside the support members 140 located in the secondary support regions R2, and the height difference X is about a thickness of the second light-shielding pattern 150 on the support member 140 located in the primary support region R1.

The design that the second light-shielding pattern 150 is overlapped with the support member 140 located in the primary support region R1 may include that the second light-shielding pattern 150 covers a top surface (not indicated, and refers to a surface of the support member 140 back facing the planarization layer 130) of the support member 140 located in the primary support region R1 and wraps a sidewall surface (not indicated) of the support member 140, and the second light-shielding pattern 150 covers (for example, completely covers) the primary support region R1, but the disclosure is not limited thereto. Moreover, the design that the second light-shielding pattern 150 is located outside the support member 140 located in the secondary support region R2 may include that the second light-shielding pattern 150 does not cover the top surface of the support member 140 located in the secondary support region R2 and does not wrap the sidewall surface of the support member 140, and the second light-shielding pattern 150 does not cover the secondary support region R2, but the disclosure is not limited thereto.

Under the above framework, the support member 140 located in the primary support region R1 and the second light-shielding pattern 150 thereon may serve as a primary support member 140A for maintaining a liquid crystal cell gap, and the support member 140 located in the secondary support region R2 may serve as a secondary support member for providing appropriate support during pressing. In the embodiment, as shown in FIG. 1E and FIG. 2, since the primary support member 140A is composed of the support member 140 and the second light-shielding pattern 150 thereon, and the secondary support member is only composed of the support member 140, a width W140A of the primary support member 140A is greater than a width of the secondary support member (i.e., the width W140 of the support member 140), and a thickness T140A of the primary support member 140A is greater than a thickness of the secondary support member (i.e., the thickness T140 of the support member 140).

After the step of FIG. 1E, the opposite substrate 10 shown in FIG. 2 is preliminarily completed. The opposite substrate 10 includes the substrate 100, the first light-shielding patterns 110, the second light-shielding patterns 150, the planarization layer 130, and the support members 140. The first light-shielding patterns 110 are located on the substrate 100 and respectively extend along the first direction D1 (with reference to FIG. 1E), where a material of the first light-shielding patterns 110 includes an organic material. The second light-shielding patterns 150 are located on the substrate 100 and are intersected with the first light-shielding patterns 110. The second light-shielding patterns 150 respectively extend along the second direction D2 (with reference to FIG. 1E), and a material of the second light-shielding patterns 150 includes metal. The planarization layer 130 is overlapped with the first light-shielding patterns 110 and the second light-shielding patterns 150. The first light-shielding patterns 110 and the second light-shielding patterns 150 are respectively located on opposite sides of the planarization layer 130. The support members 140 are located on the primary support regions R1 and the secondary support regions R2 of the opposite substrate 10. In addition, as described above, the opposite substrate 10 may selectively include the color filter pattern layer 120. The color filter pattern layer 120 is located between the first light-shielding patterns 110 and the planarization layer 130.

In the embodiment, the first light-shielding patterns 110 are located between the planarization layer 130 and the substrate 100. The planarization layer 130 is located between the support members 140 and the first light-shielding patterns 110. The support members 140 are located between the second light-shielding patterns 150 and the planarization layer 130. In addition, the first light-shielding patterns 110 are overlapped with the support members 140 located in the primary support regions R1 and the secondary support regions R2. Moreover, the second light-shielding patterns 150 are overlapped with the support members 140 located in the primary support regions R1, and the second light-shielding patterns 150 are located outside the support members 140 located in the secondary support regions R2.

In the opposite substrate 10, the second light-shielding patterns 150 may serve to shield components in the display that are not intended to be seen by the user (for example, the data lines of the active device array substrate in the display). Therefore, in comparison with shielding light by only stacking color resists, the opposite substrate 10 has better light-shielding ability, and is adapted to mitigate the problem of light mixture. In addition, to produce a grid-like light-shielding pattern by using a grid-like photomask is likely to cause an insufficient aperture ratio due to exposure (diffraction and interference of light) at an edge corner of the photomask. For example, under high resolution, the edge corner of the light-shielding pattern formed by the grid-like photomask is likely to have a serious rounding problem. Comparatively, in the opposite substrate 10, the first light-shielding patterns 110 and the second light-shielding patterns 150 extending in different directions are fabricated on the substrate 110 in batches and are intersected with each other. Therefore, the insufficient aperture ratio caused by the aforementioned rounding problem may be avoided. In addition, in the opposite substrate 10, the height difference X between the primary support region R1 and the secondary support region R2 may be provided by the second light-shielding pattern 150. Therefore, the support member 140 located in the primary support region R1 and the support member 140 located in the secondary support region R2 may have the same thickness T140. Compared with a situation of selecting support members with different thicknesses as the primary support members and the secondary support members, to select the support members with the same thickness may help reducing the difficulty of selecting the support members.

Figure 3A:
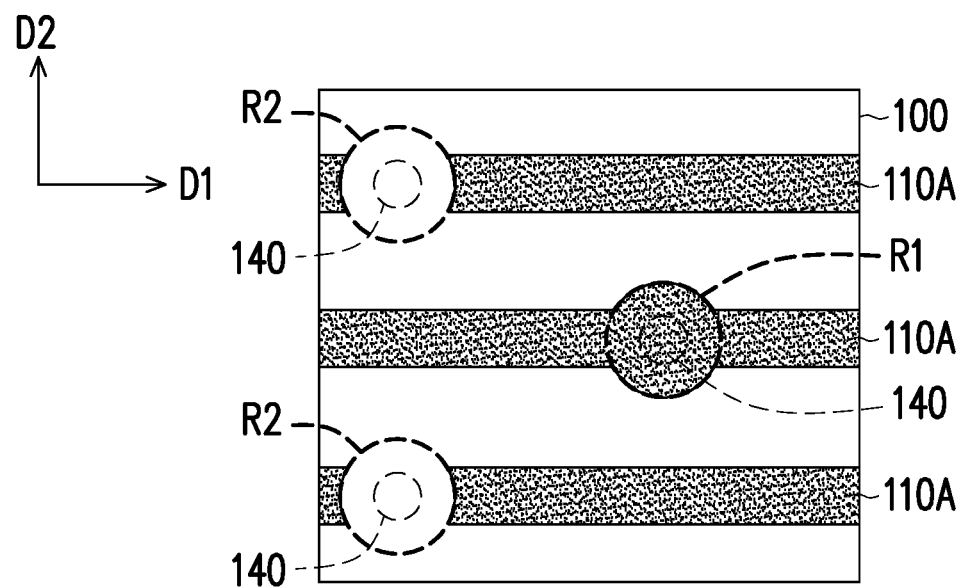
FIG. 3A and FIG. 3B are schematic partial top views of a part of a manufacturing process of an opposite substrate according to a second embodiment of the disclosure.
Figure 3B:
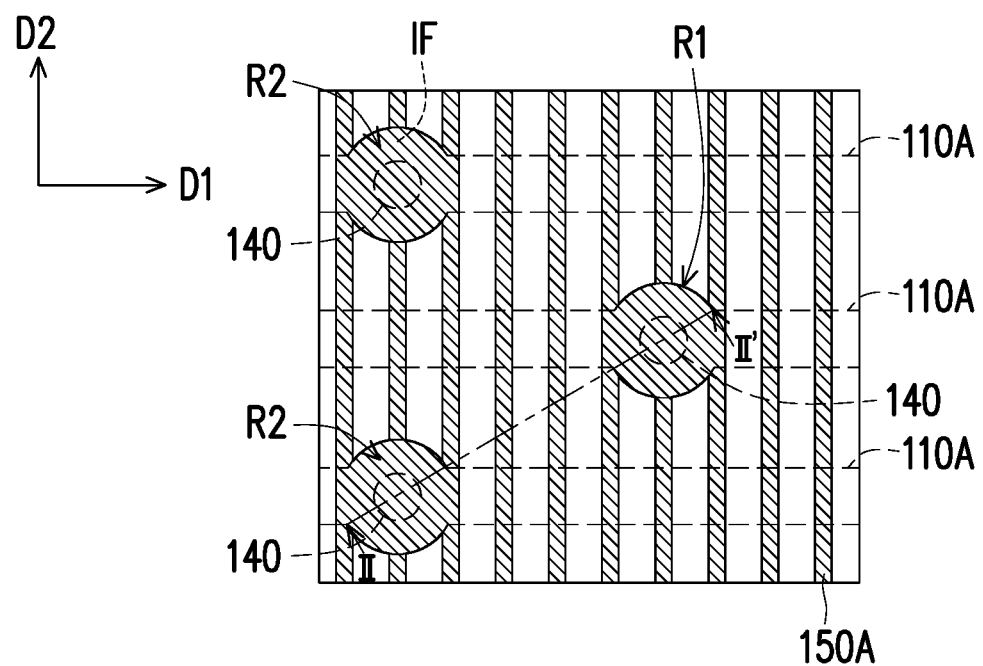
Figure 4:
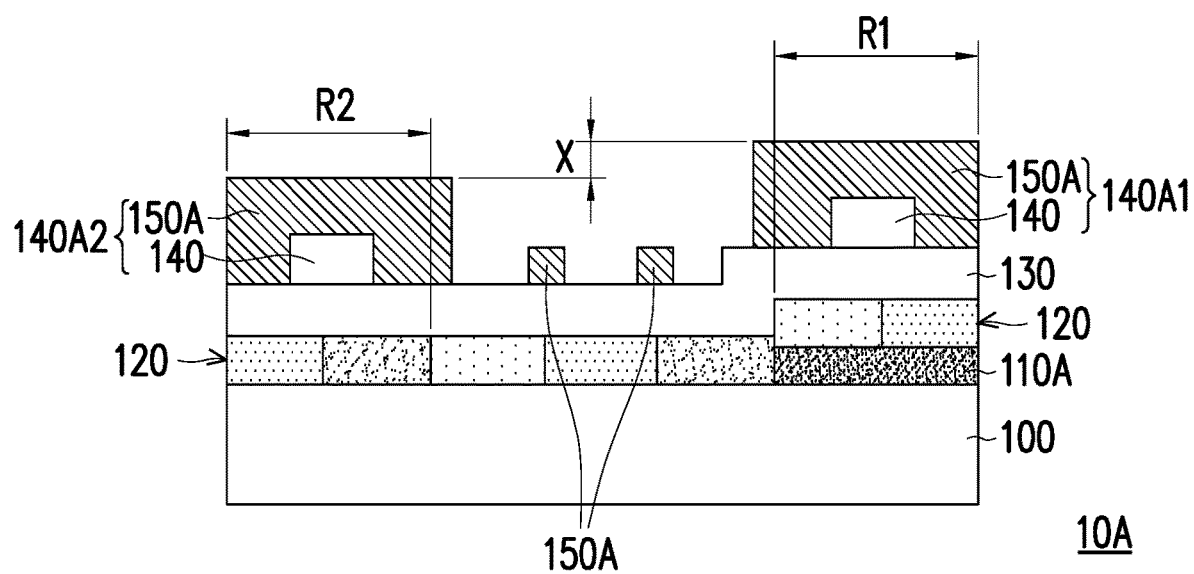
FIG. 4 is a schematic cross-sectional view of FIG. 3B along a section line II-II'.

FIG. 3A and FIG. 3B are schematic partial top views of a part of a manufacturing process of an opposite substrate according to a second embodiment of the disclosure. FIG. 4 is a schematic cross-sectional view of FIG. 3B along a section line II-II'.

A main difference between a manufacturing process of an opposite substrate 10A of the second embodiment and the manufacturing process of the opposite substrate 10 of the first embodiment is that a step shown in FIG. 3A is applied to replace the step shown in FIG. 1A, and a step shown in FIG. 3B is applied to replace the step shown in FIG. 1E. Namely, the manufacturing process of the opposite substrate 10A sequentially includes: forming a plurality of first light-shielding patterns 110A (FIG. 3A), forming the color filter pattern layer 120 (FIG. 1B), forming the planarization layer 130 (FIG. 1C), forming the support members 140 (FIG. 1D), and forming a plurality of second light-shielding patterns 150A (FIG. 3B). It should be noted that in order to clearly show a relative configuration relationship between the first light-shielding patterns 110A and the support members 140, configuration positions of the support members 140 are indicated by thin dotted lines in FIG. 3A, but the support members 140 are not yet formed on the substrate 100 in the step of FIG. 3A.

With reference to FIG. 3A and FIG. 4, a main difference between the first light-shielding patterns 110A and the first light-shielding patterns 110 in FIG. 1A and FIG. 2 is that the first light-shielding patterns 110A are overlapped with the support members 140 located in the primary support regions R1, and the first light-shielding patterns 110A are located outside the support members 140 located in the secondary support regions R2.

The design that the first light-shielding pattern 110A is overlapped with the support member 140 located in the primary support region R1 may include that the first light-shielding pattern 110A covers the primary support region R1, for example, completely covers the primary support region R1. In this way, the first light-shielding pattern 110A located at the primary support region R1 may better shield light leakage caused by factors such as displacement of the support members and poor tilting direction and/or angle of the liquid crystal molecules. Moreover, the design that the first light-shielding pattern 110A is located outside the support member 140 located in the secondary support region R2 may include that the first light-shielding pattern 110A is not overlapped with the support member 140 located in the secondary support region R2, or is not overlapped with any component in the secondary support region R2 (i.e., not overlapped with the secondary support region R2), but the disclosure is not limited thereto.

With reference to FIG. 3B and FIG. 4, a main difference between the second light-shielding patterns 150A and the second light-shielding patterns 150 of FIG. 1E and FIG. 2 is that the second light-shielding patterns 150A are overlapped with the support members 140 located in the primary support regions R1 and the secondary support regions R2.

The design that the second light-shielding pattern 150A is overlapped with the support member 140 located in the primary support region R1 may include that the second light-shielding pattern 150A covers a top surface of the support member 140 located in the primary support region R1 and wraps a sidewall surface of the support member 140, and the second light-shielding pattern 150A covers (for example, completely covers) the primary support region R1, but the disclosure is not limited thereto. Moreover, the design that the second light-shielding pattern 150A is overlapped with the support member 140 located in the secondary support region R2 may include that the second light-shielding pattern 150A covers a top surface of the support member 140 located in the secondary support region R2 and wraps a sidewall surface of the support member 140, and the second light-shielding pattern 150A covers (for example, completely covers) the secondary support region R2, but the disclosure is not limited thereto.

In the first embodiment, as shown in FIG. 2, the height difference X between the primary support region R1 and the secondary support region R2 is mainly provided by the second light-shielding pattern 150. In the embodiment, as shown in FIG. 4, the height difference X between the primary support region R1 and the secondary support region R2 is mainly provided by the first light-shielding pattern 110. In detail, under the framework that the primary support region R1 and the secondary support region R2 are all configured with the color filter pattern layer 120, the planarization layer 130, the support members 140 and the second light-shielding patterns 150A, and the support member 140 located in the primary support region R1 and the support member 140 located in the secondary support region R2 have the same thickness T140 (with reference to FIG. 2), the height difference X between the primary support region R1 and the secondary support region R2 may be formed by forming the first light-shielding pattern 110 in the primary support region R1 and not forming the first light-shielding pattern 110 in the secondary support region R2, and the height difference X is about the thickness of the first light-shielding pattern 110A located in the primary support region R1.

Under the above framework, the support member 140 located in the primary support region R1 and the second light-shielding pattern 150 thereon may serve as a primary support member 140A1 for maintaining the liquid crystal cell gap, and the support member 140 located in the secondary support region R2 and the second light-shielding pattern 150 thereon may serve as a secondary support member 140A2 for providing appropriate support during pressing. In the embodiment, as shown in FIG. 3B and FIG. 4, since the primary support member 140A1 and the secondary support member 140A2 are all composed of the support member 140 and the second light-shielding pattern 150 thereon, the primary support member 140A1 and the secondary support member 140A2 substantially have a same width (not indicated) and a same thickness (not indicated).

Figure 5A:
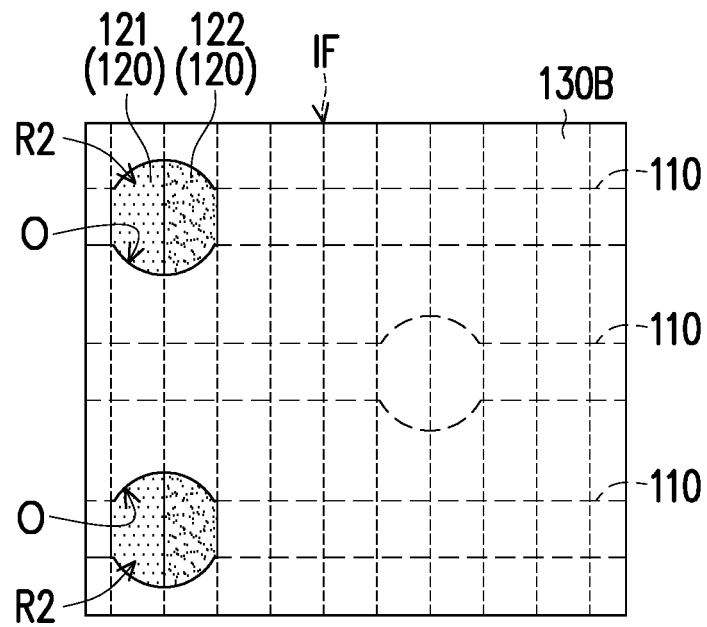
FIG. 5A to FIG. 5C are schematic partial top views of a part of a manufacturing process of an opposite substrate according to a third embodiment of the disclosure.
Figure 5B:
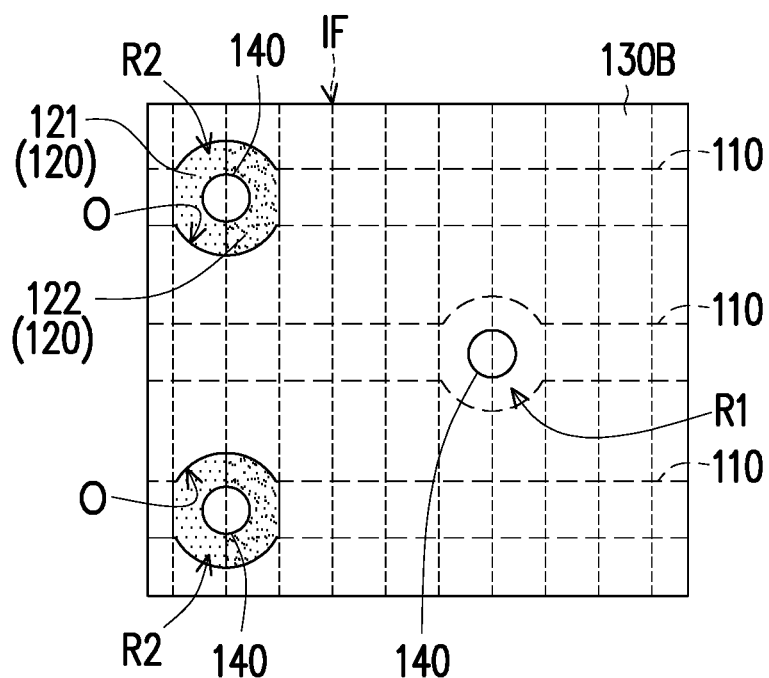
Figure 5C:
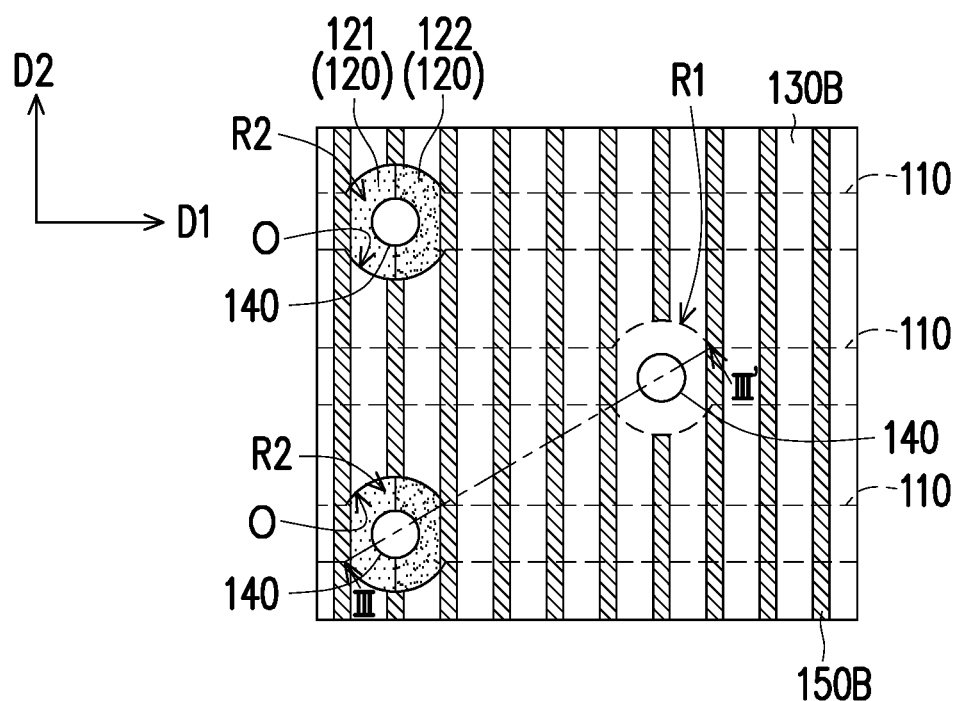
Figure 6:
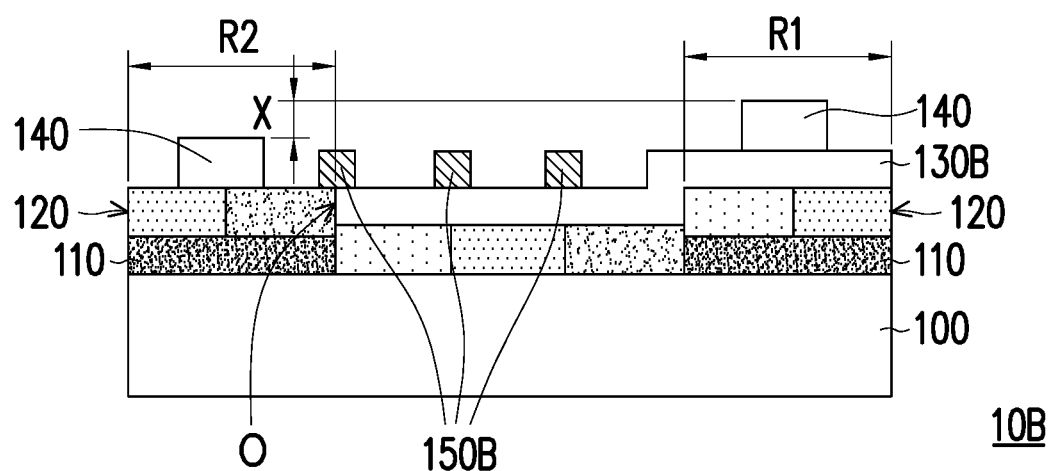
FIG. 6 is a schematic cross-sectional view of FIG. 5C along a section line III-III'.

FIG. 5A and FIG. 5C are schematic partial top views of a part of a manufacturing process of an opposite substrate according to a third embodiment of the disclosure. FIG. 6 is a schematic cross-sectional view of FIG. 5C along a section line.

A main difference between a manufacturing process of an opposite substrate 10B of the third embodiment and the manufacturing process of the opposite substrate 10 of the first embodiment is that steps shown in FIG. 5A to FIG. 5C are applied to replace the steps shown in FIG. 1C to FIG. 1E. Namely, the manufacturing process of the opposite substrate 10B sequentially includes: forming the first light-shielding patterns 110 (FIG. 1A), forming the color filter pattern layer 120 (FIG. 1B), forming a planarization layer 130B (FIG. 5A), forming the support members 140 (FIG. 5B), and forming a plurality of second light-shielding patterns 150B (FIG. 5C).

With reference to FIG. 5A and FIG. 6, a main difference between the planarization layer 130B and the planarization layer 130 of FIG. 1C and FIG. 2 is that the planarization layer 130B has a plurality of openings O respectively overlapped with the support members 140 located in the secondary support regions R2. The openings O expose the color filter pattern layer 120 located under the planarization layer 130B. In the embodiment, an area of each opening O is substantially the same as an area of the secondary support region R2, but the disclosure is not limited thereto.

With reference to FIG. 5B and FIG. 6, the support members 140 are configured in the primary support regions R1 and the secondary support regions R2. At the primary support region R1, the support member 140 is disposed on the planarization layer 130B. On the other hand, at the secondary support region R2, the support member 140 is located on the color filter pattern layer 120 exposed by the opening O.

With reference to FIG. 5C and FIG. 6, a main difference between the second light-shielding patterns 150B and the second light-shielding patterns 150 of FIG. 1E and FIG. 2 is that the second light-shielding patterns 150B are located outside the support members 140 located in the primary support regions R1 and the secondary support regions R2. The design that the second light-shielding pattern 150B is located outside the support members 140 located in the primary support region R1 and the secondary support region R2 may include that the second light-shielding pattern 150B is not overlapped with the support members 140 located in the primary support region R1 and the secondary support region R2, or is not overlapped with the primary support region R1 and the secondary support region R2 at all, but the disclosure is not limited thereto.

In the first embodiment, as shown in FIG. 2, the height difference X between the primary support region R1 and the secondary support region R2 is mainly provided by the second light-shielding pattern 150. In the embodiment, as shown in FIG. 6, the height difference X between the primary support region R1 and the secondary support region R2 is mainly provided by the planarization layer 130B. In detail, under the framework that the primary support region R1 and the secondary support region R2 are all configured with the first light-shielding patterns 110, the color filter pattern layer 120 and the support members 140, and the support member 140 located in the primary support region R1 and the support member 140 located in the secondary support region R2 have the same thickness T140 (with reference to FIG. 2), the height difference X between the primary support region R1 and the secondary support region R2 may be formed by forming the opening O of the planarization layer 130B in the secondary support region R2 (i.e. removing the planarization layer 130B located in the secondary support region R2), and the height difference X is about the thickness of the planarization layer 130B in the primary support region R1.

Under the above framework, the support member 140 located in the primary support region R1 serves as a primary support member for maintaining the liquid crystal cell gap, and the support member 140 located in the secondary support region R2 serves as a secondary support member for providing appropriate support during pressing. In the embodiment, as shown in FIG. 5C and FIG. 6, since the primary support member and the secondary support member are respectively composed of the support member 140, the primary support member and the secondary support member have a same width (not indicated) and a same thickness (not indicated).

FIG. 7A to FIG. 7E are schematic partial top views of a part of a manufacturing process of an opposite substrate according to a fourth embodiment of the disclosure. FIG. 8 is a schematic cross-sectional view of FIG. 7E along a section line IV-IV'.

A main difference between a manufacturing process of an opposite substrate 10C of the fourth embodiment and the manufacturing process of the opposite substrate 10 of the first embodiment lies in a manufacturing sequence of multiple film layers. To be specific, the manufacturing process of the opposite substrate 10C sequentially includes: forming the second light-shielding patterns 150A (FIG. 7A), forming the first light-shielding patterns 110 (FIG. 7B), forming the color filter pattern layer 120 (FIG. 7C), forming the planarization layer 130B (FIG. 7D), and forming the support members 140 (FIG. 7E). According to the above manufacturing process, the second light-shielding patterns 150A are located between the first light-shielding patterns 110 and the substrate 100. The first light-shielding patterns 110 are located between the planarization layer 130B and the second light-shielding patterns 150A. The planarization layer 130B is located between the support members 140 and the first light-shielding patterns 110. In the embodiment, the opposite substrate 10C may selectively include the color filter pattern layer 120, and the color filter pattern layer 120 is located between the first light-shielding patterns 110 and the planarization layer 130B.

With reference to the description of FIG. 3B for related description of the second light-shielding patterns 150A, and detail thereof is not repeated. With reference to the description of FIG. 1A for related description of the first light-shielding patterns 110, and detail thereof is not repeated. With reference to the description of FIG. 1B for related description of the color filter pattern layer 120, and detail thereof is not repeated. With reference to the description of FIG. 5A for related description of the planarization layer 130B, and detail thereof is not repeated. With reference to the description of FIG. 5B for related description of the support members 140, and detail thereof is not repeated.

In the embodiment, as shown in FIG. 8, the height difference X between the primary support region R1 and the secondary support region R2 is mainly provided by the planarization layer 130B. In detail, under the framework that the primary support region R1 and the secondary support region R2 are all configured with the second light-shielding patterns 150A, the first light-shielding pattern 110, the color filter pattern layer 120 and the support members 140, and the support member 140 located in the primary support region R1 and the support member 140 located in the secondary support region R2 have the same thickness T140 (with reference to FIG. 2), the height difference X between the primary support region R1 and the secondary support region R2 may be formed by forming the opening O of the planarization layer 130B in the secondary support region R2 (i.e. removing the planarization layer 130B located in the secondary support region R2), and the height difference X is about the thickness of the planarization layer 130B in the primary support region R1.

Under the above framework, the support member 140 located in the primary support region R1 serves as a primary support member for maintaining the liquid crystal cell gap, and the support member 140 located in the secondary support region R2 serves as a secondary support member for providing appropriate support during pressing. In the embodiment, as shown in FIG. 7E and FIG. 8, since the primary support member and the secondary support member are respectively composed of the support member 140, the primary support member and the secondary support member have a same width (not indicated) and a same thickness (not indicated).

Figure 9:
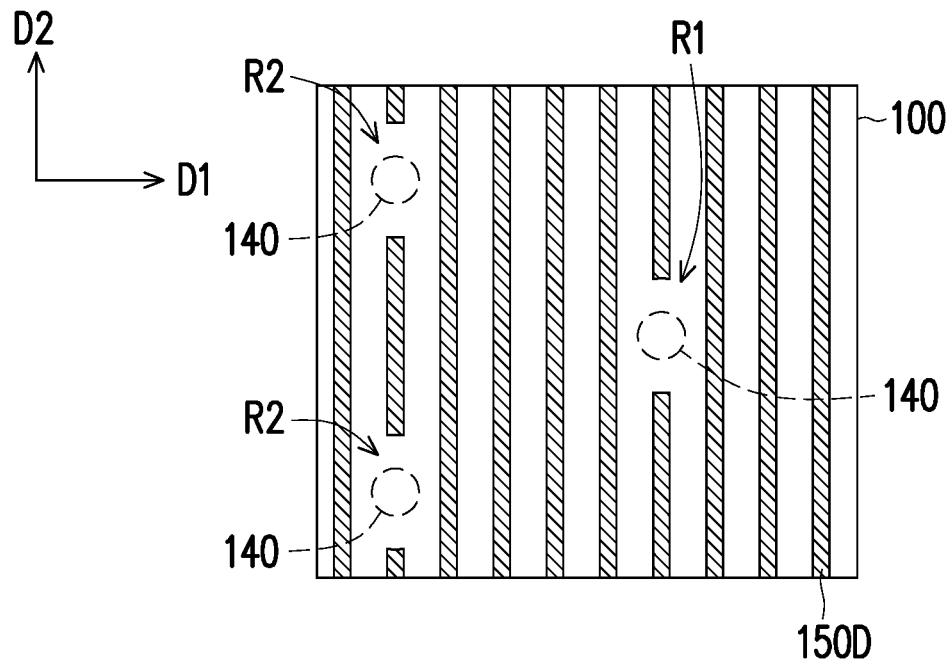
FIG. 9 is a schematic partial top view of a part of a manufacturing process of an opposite substrate according to a fifth embodiment of the disclosure.
Figure 10:
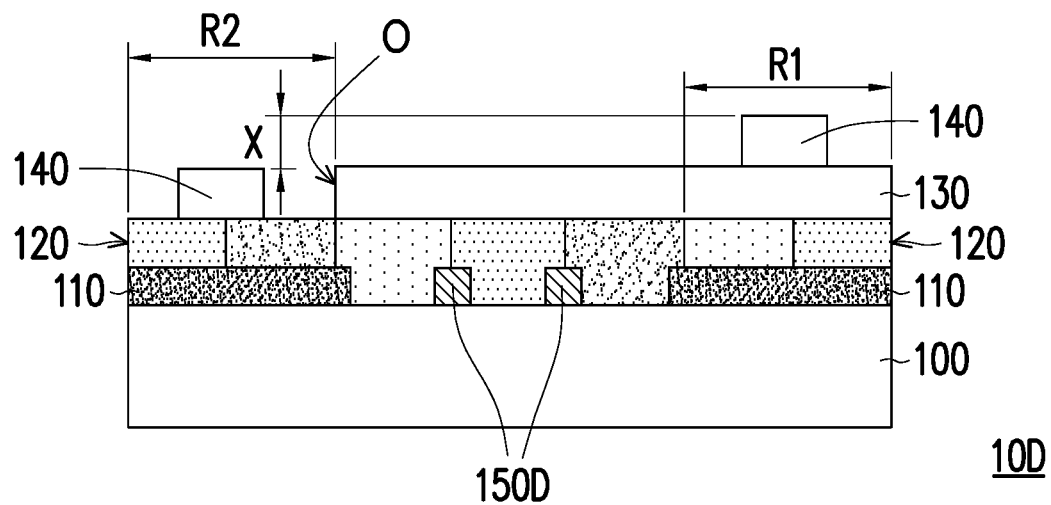
FIG. 10 is a schematic partial cross-sectional view of the opposite substrate of the fifth embodiment.

FIG. 9 is a schematic partial top view of a part of a manufacturing process of an opposite substrate according to a fifth embodiment of the disclosure. FIG. 10 is a schematic partial cross-sectional view of the opposite substrate of the fifth embodiment.

Figure 7A:
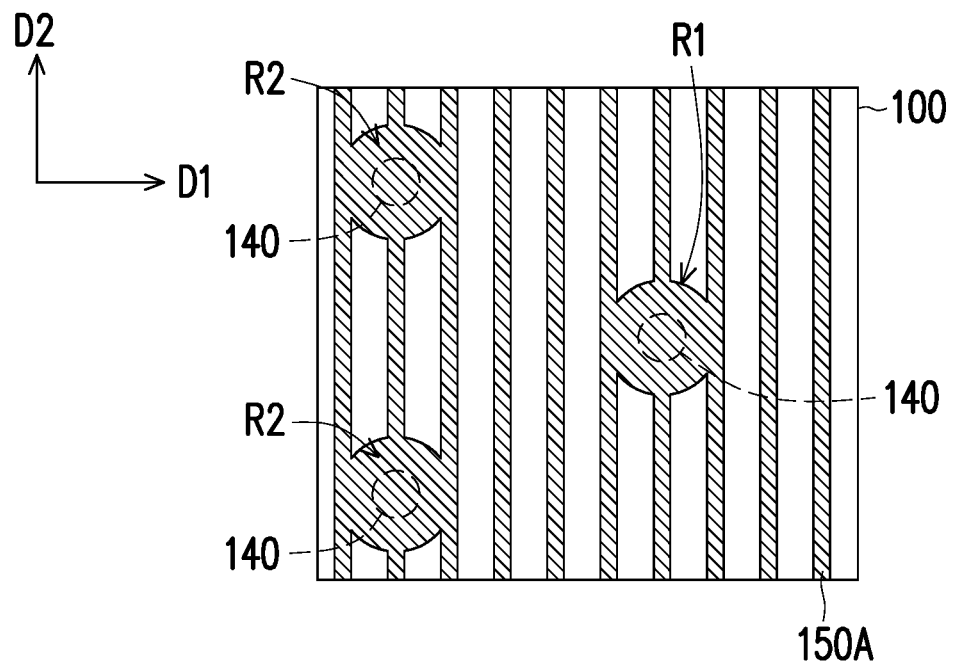
FIG. 7A to FIG. 7E are schematic partial top views of a part of a manufacturing process of an opposite substrate according to a fourth embodiment of the disclosure.
Figure 7B:
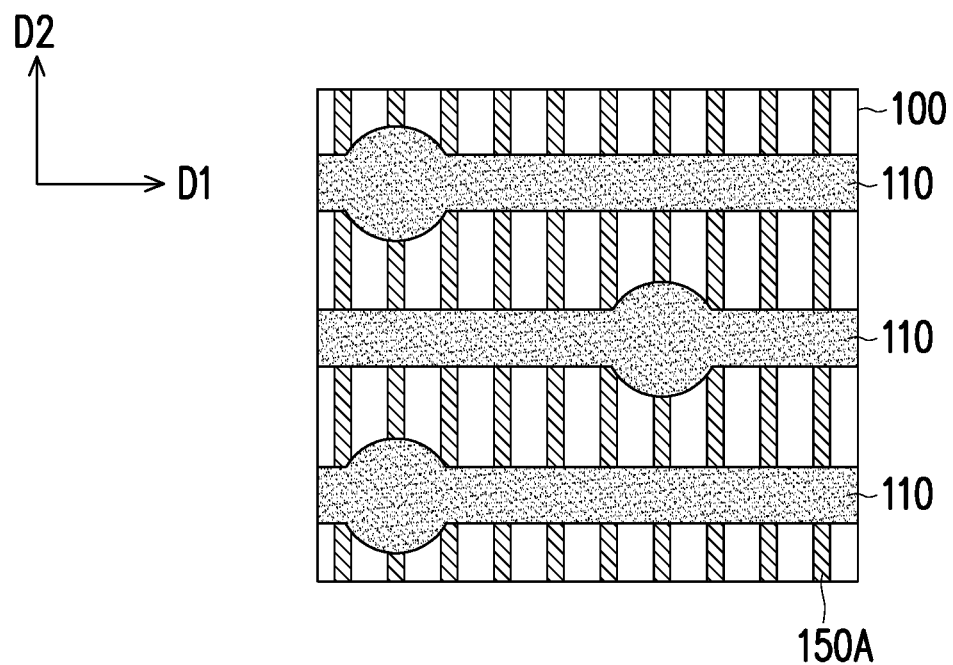
Figure 7C:
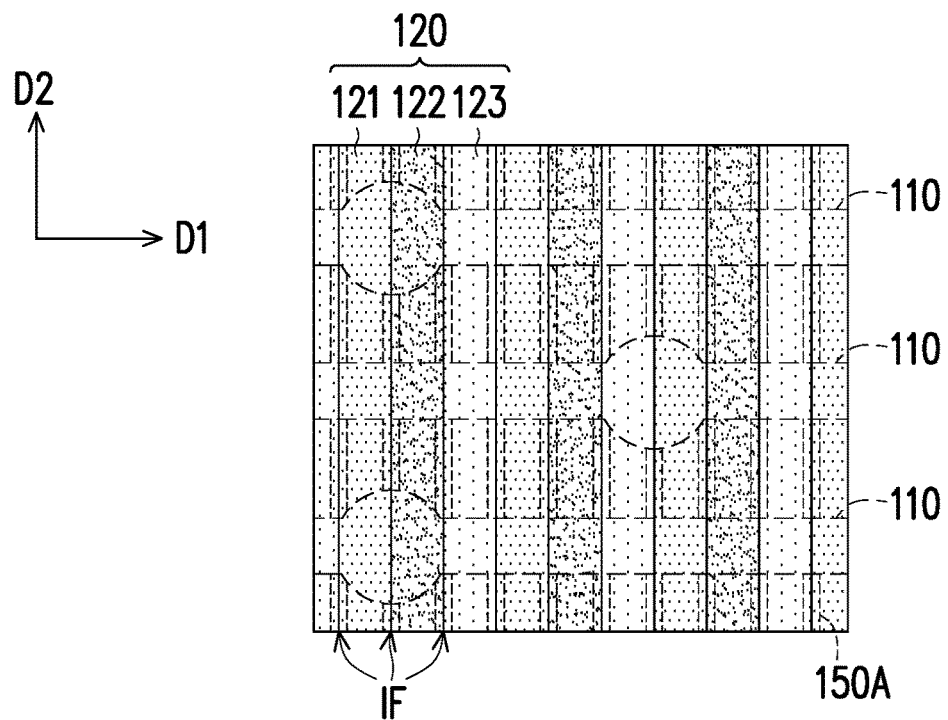
Figure 7D:
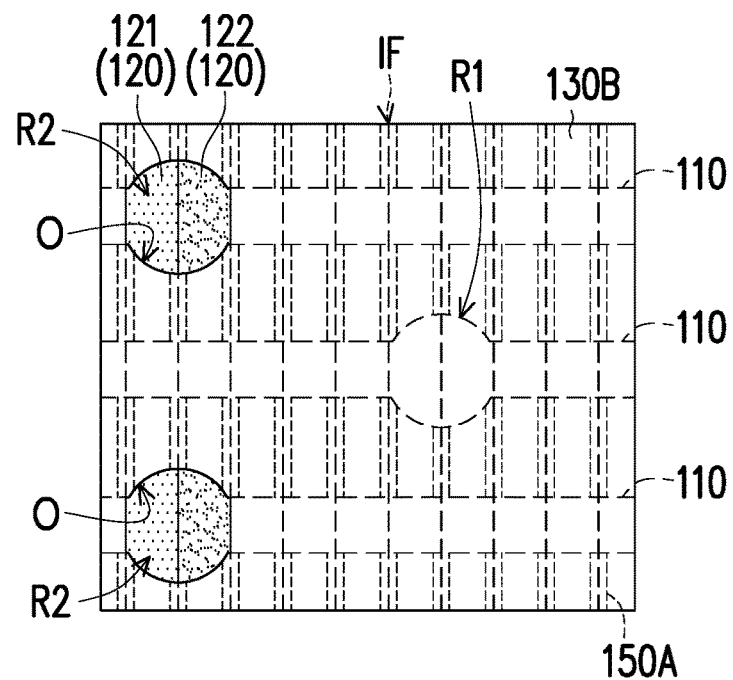
Figure 7E:
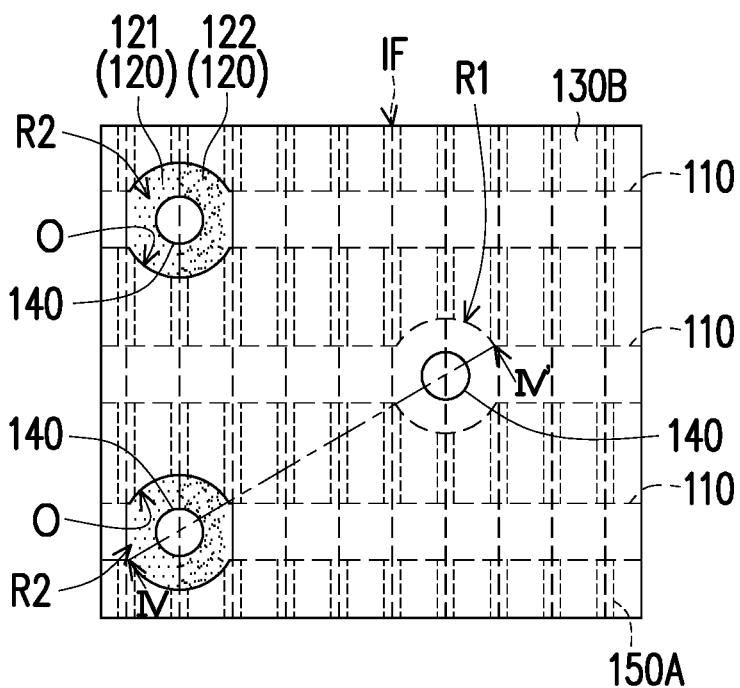
Figure 8:
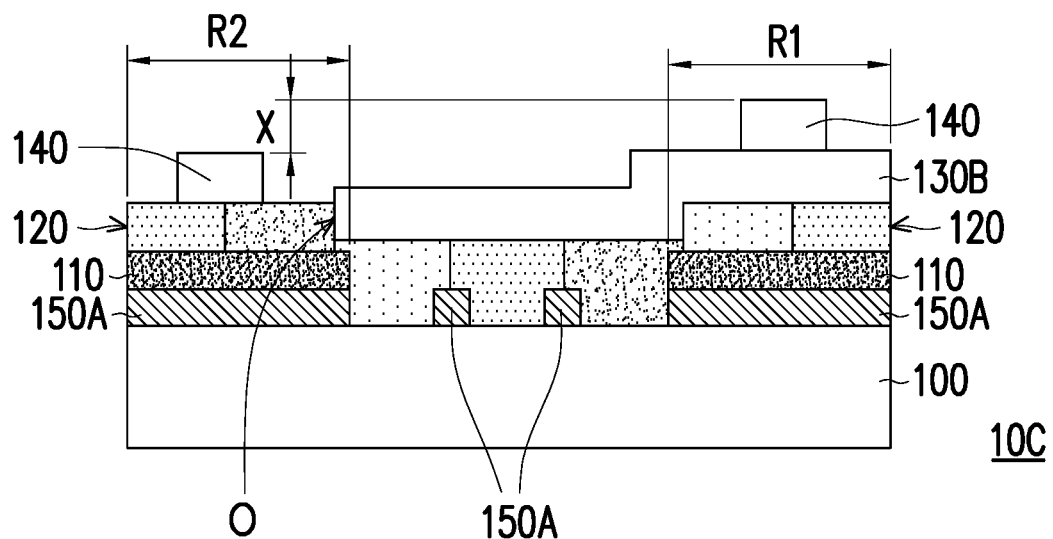
FIG. 8 is a schematic cross-sectional view of FIG. 7E along a section line IV-IV'.

A main difference between a manufacturing process of an opposite substrate 10D of the fifth embodiment and the manufacturing process of the opposite substrate 10C of the fourth embodiment is that a step shown in FIG. 9 is applied to replace the step shown in FIG. 7A. Namely, the manufacturing process of the opposite substrate 10D sequentially includes: forming a plurality of second light-shielding patterns 150D (FIG. 9), forming the first light-shielding patterns 110 (FIG. 7B), forming the color filter pattern layer 120 (FIG. 7C), forming the planarization layer 130B (FIG. 7D), and forming the support members 140 (FIG. 7E). It should be noted that in order to clearly show a relative configuration relationship between the second light-shielding patterns 150D and the support members 140, configuration positions of the support members 140 are indicated by thin dotted lines in FIG. 9, but the support members 140 are not yet formed on the substrate 100 in the step of FIG. 9.

With reference to FIG. 9 and FIG. 10, a main difference between the second light-shielding patterns 150D and the second light-shielding patterns 150A of FIG. 7A and FIG. 8 is that the second light-shielding patterns 150A are located outside the support members 140 located in the primary support regions R1 and the secondary support regions R2. The design that the second light-shielding pattern 150D is located outside the support members 140 located in the primary support region R1 and the secondary support region R2 may include that the second light-shielding pattern 150D is not overlapped with the support members 140 in the primary support region R1 and the secondary support region R2, or is not overlapped with the primary support region R1 and the secondary support region R2 at all, but the disclosure is not limited thereto.

In the embodiment, as shown in FIG. 10, the height difference X between the primary support region R1 and the secondary support region R2 is mainly provided by the planarization layer 130B. In detail, under the framework that the primary support region R1 and the secondary support region R2 are all configured with the first light-shielding patterns 110, the color filter pattern layer 120 and the support members 140, and the support member 140 located in the primary support region R1 and the support member 140 located in the secondary support region R2 have the same thickness T140 (with reference to FIG. 2), the height difference X between the primary support region R1 and the secondary support region R2 may be formed by forming the opening O of the planarization layer 130B in the secondary support region R2 (i.e. removing the planarization layer 130B located in the secondary support region R2), and the height difference X is about the thickness of the planarization layer 130B in the primary support region R1.

Under the above framework, the support member 140 located in the primary support region R1 serves as a primary support member for maintaining the liquid crystal cell gap, and the support member 140 located in the secondary support region R2 serves as a secondary support member for providing appropriate support during pressing. In the embodiment, as shown in FIG. 10, since the primary support member and the secondary support member are respectively composed of the support member 140, the primary support member and the secondary support member have a same width (not indicated) and a same thickness (not indicated).

FIG. 11A to FIG. 11F are schematic partial top views of a part of a manufacturing process of an opposite substrate according to a sixth embodiment of the disclosure. FIG. 12 is a schematic cross-sectional view of FIG. 11F along a section line V-V'.

Figure 11A:
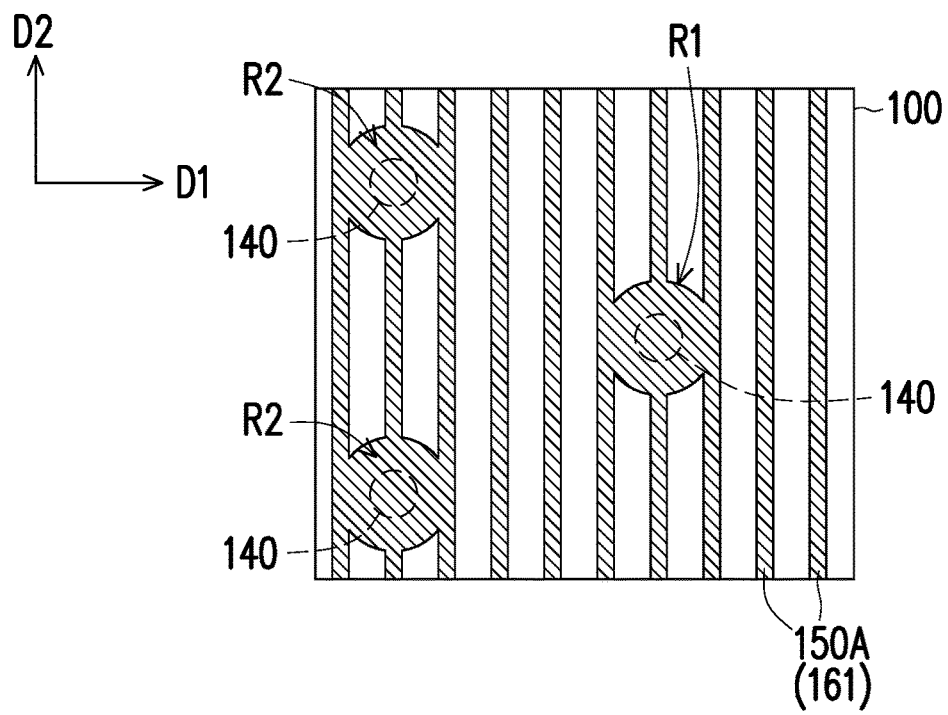
FIG. 11A to FIG. 11F are schematic partial top views of a part of a manufacturing process of an opposite substrate according to a sixth embodiment of the disclosure.
Figure 12:
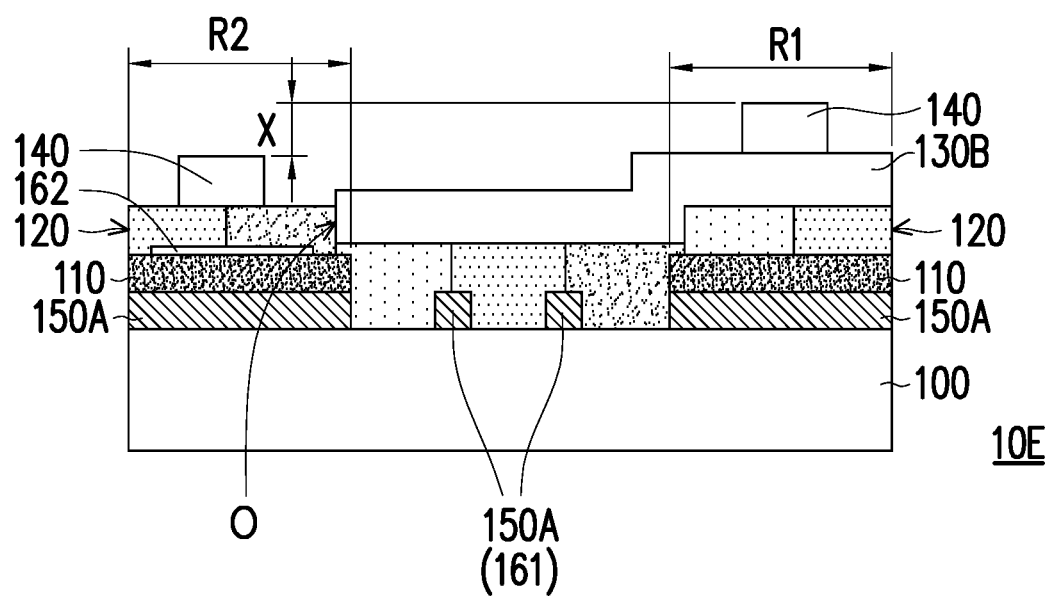
FIG. 12 is a schematic cross-sectional view of FIG. 11F along a section line V-V.

It should be noted that in order to clearly show a relative configuration relationship between the second light-shielding patterns 150A and the support members 140, configuration positions of the support members 140 are indicated by thin dotted lines in FIG. 11A, but the support members 140 are not yet formed on the substrate 100 in the step of FIG. 11A.

The manufacturing process of an opposite substrate 10E of the sixth embodiment is similar to the manufacturing process of the opposite substrate 10C of the fourth embodiment, and a main difference there between is that the manufacturing process of the opposite substrate 10E further includes: forming a plurality of second touch electrodes 162 on the first light-shielding patterns 110, which is specifically described below with reference to FIG. 11A to FIG. 11F and FIG. 12.

Figure 11B:
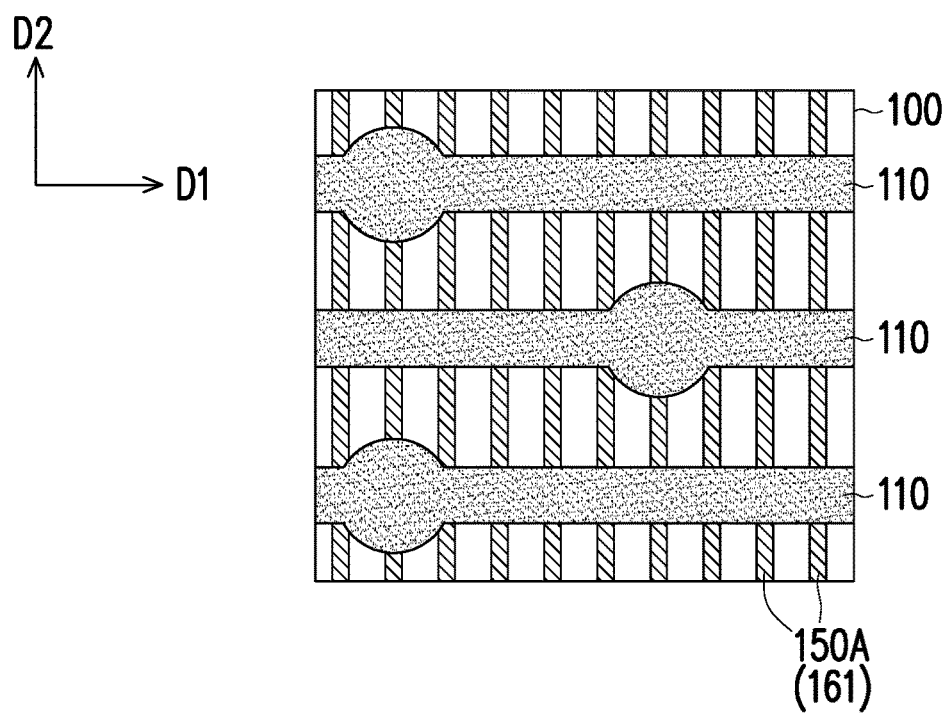
Figure 11C:
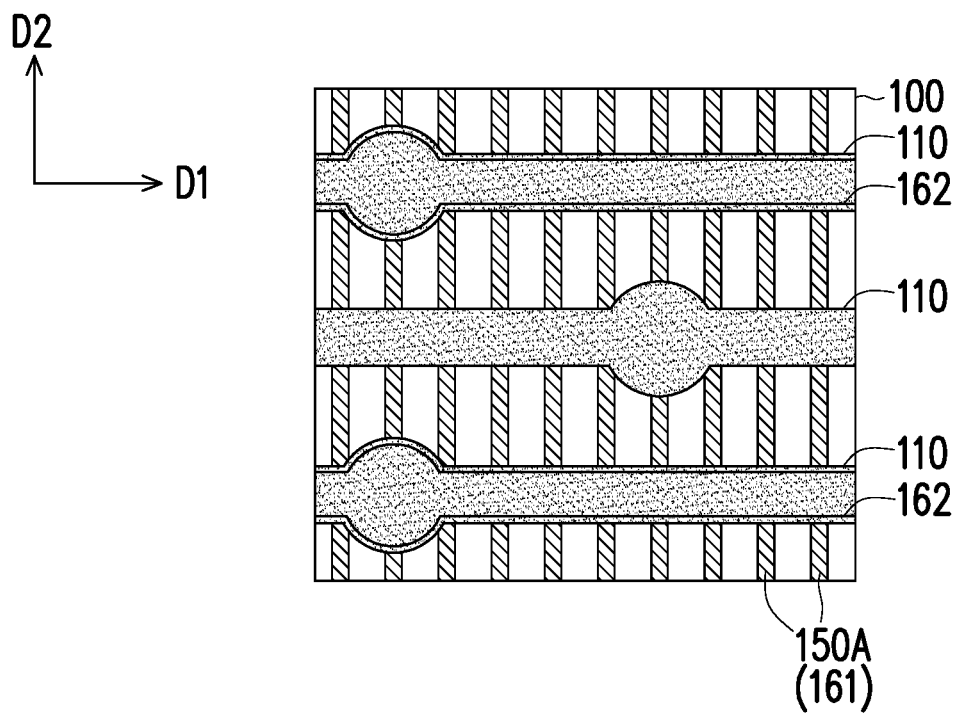
Figure 11D:
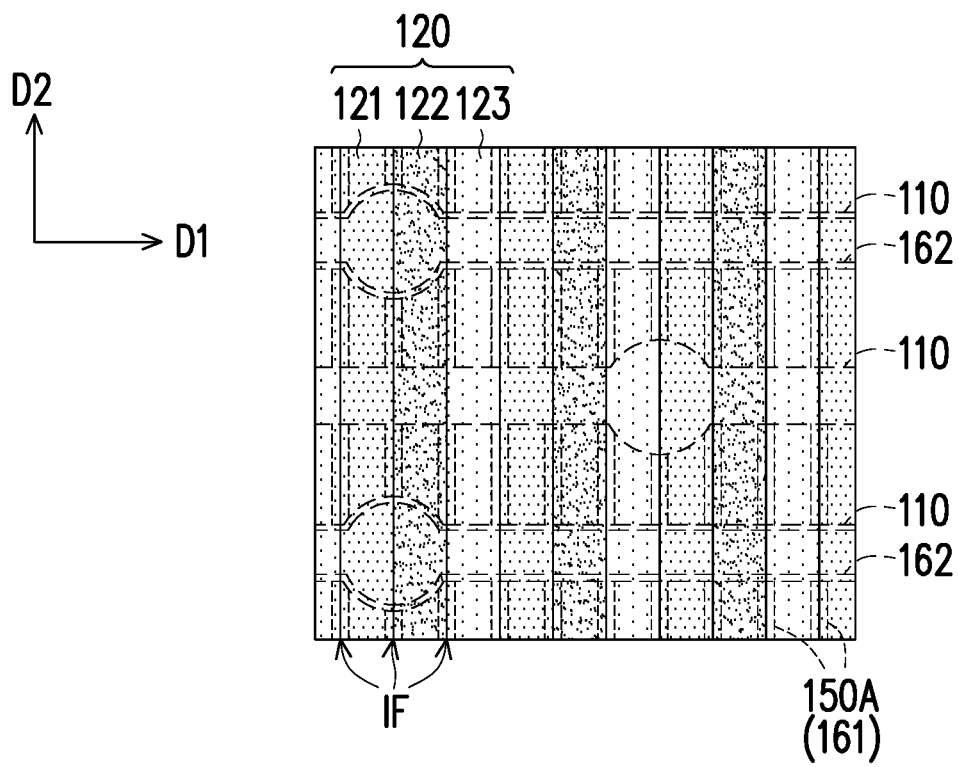
Figure 11E:
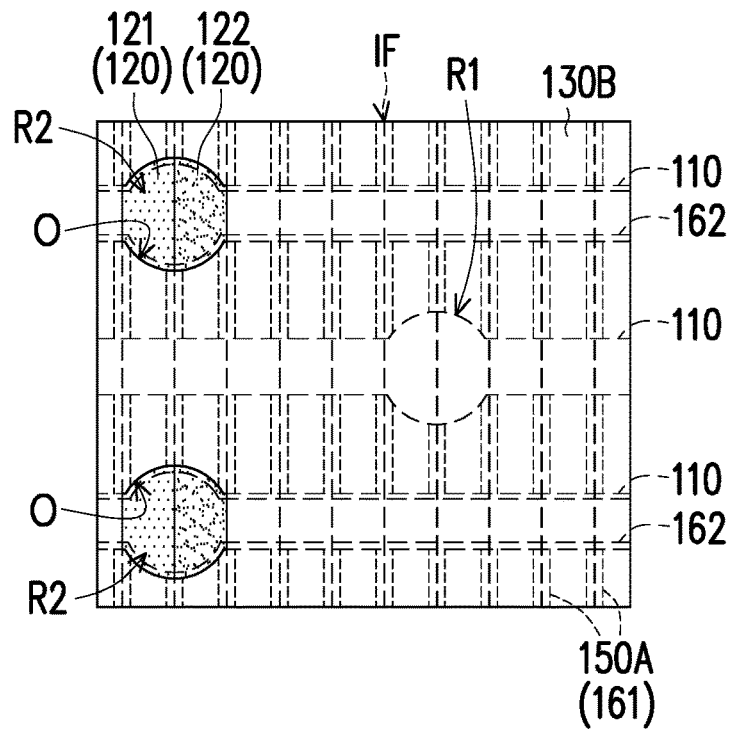
Figure 11F:
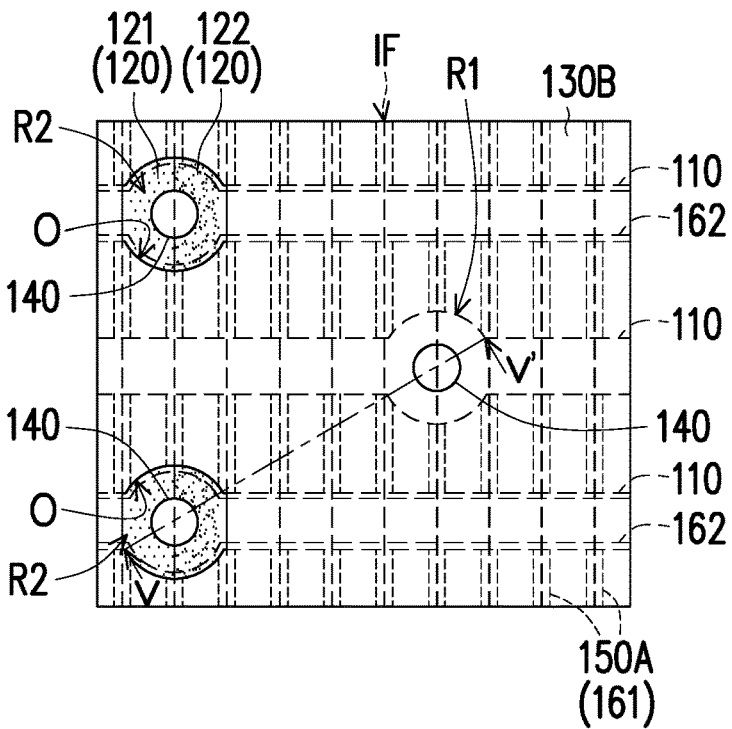

With reference to FIG. 11A to FIG. 11F and FIG. 12, the manufacturing process of the opposite substrate 10E sequentially includes: forming the second light-shielding patterns 150A (FIG. 11A), forming the first light-shielding patterns 110 (FIG. 11B), forming the second touch electrodes 162 (FIG. 11C), forming the color filter pattern layer 120 (FIG. 11D), forming the planarization layer 130B (FIG. 11E), and forming the support members 140 (FIG. 11F).

According to the above manufacturing process, as shown in FIG. 12, the second light-shielding patterns 150A are located between the first light-shielding patterns 110 and the substrate 100. The touch electrodes 162 are disposed on the first light-shielding patterns 110. The first light-shielding patterns 110 are located between the touch electrodes 162 and the second light-shielding patterns 150A. The touch electrodes 162 are located between the planarization layer 130B and the first light-shielding patterns 110. The planarization layer 130B is located between the support members 140 and the touch electrodes 162.

In the embodiment, the touch electrode 162 is, for example, a transparent conductive layer, which includes a metal oxide, such as indium tin oxide, indium zinc oxide, aluminum tin oxide, aluminum zinc oxide, indium germanium zinc oxide, or other suitable oxides, or a stacked layer of at least two of the above oxides. However, the disclosure is not limited thereto, and according to other embodiments, the touch electrode 162 may also be made of other conductive materials.

In the embodiment, the opposite substrate 10E may also selectively include the color filter pattern layer 120, and the color filter pattern layer 120 may be selectively located between the touch electrodes 162 and the planarization layer 130B. However, the disclosure is not limited thereto. According to other embodiments, the color filter pattern layer 120 may also be disposed at other appropriate positions. For example, in another embodiment, the touch electrodes 162 may also be formed on the color filter pattern layer 120, and the color filter pattern layer 120 may also be located between the touch electrodes 162 and the first light-shielding patterns 110.

With reference to FIG. 11C, FIG. 11F and FIG. 12, it should be noted that in the embodiment, at least a part of the second light-shielding patterns 150A including metal may serve as a plurality of touch electrodes 161, where the touch electrodes 161 are intersected with the touch electrodes 162. The touch electrodes 161 and the touch electrodes 162 may construct touch sensing elements. For example, one of the touch electrode 161 and the touch electrode 162 may serve as a transmission pattern (Tx), and the other one of the touch electrode 161 and the touch electrode 162 may serve as a reception pattern (Rx). In this way, the opposite substrate 10E further has a touch function in addition to the advantages of the aforementioned opposite substrate 10C.

In addition to the display function, a display including the opposite substrate 10E also has a touch function. With reference to FIG. 11C and FIG. 12, for example, in the embodiment, a touch resolution of the display may be smaller than a display resolution of the display, some first light-shielding patterns 110 are configured with the touch electrodes 162, and some other first light-shielding patterns 110 are not configured with the touch electrode 162. However, the disclosure is not limited thereto, and in other embodiments, if the touch resolution is enhanced, it is also possible to configure the corresponding touch electrode 162 on each of the first light-shielding patterns 110.

With reference to FIG. 11A, FIG. 11B and FIG. 12, in the embodiment, a region where the second light-shielding pattern 150A is overlapped with the support member 140 and is approximately circular, and a stripe-like region where the second light-shielding pattern 150A is intersected with the first light-shielding pattern 110 may be selectively connected without being disconnected. However, the disclosure is not limited thereto, and in other embodiments, the region where the second light-shielding pattern 150A is overlapped with the support member 140 and is approximately circular, and the stripe-like region where the second light-shielding pattern 150A is intersected with the first light-shielding pattern 110 may also be disconnected, and the stripe-like region of the second light-shielding pattern 150A disconnected from the approximate circular region may not serve as the touch electrode 161. Moreover, the aforementioned disconnections may be arranged irregularly to avoid being perceived by human eyes, so as to reduce mura of the display using the opposite substrate 10E.

With reference to FIG. 11A, FIG. 11C and FIG. 12, in the embodiment, the first light-shielding patterns 110 are located between the touch electrodes 161 and the touch electrodes 162 that are intersected with each other, and the first light-shielding patterns 110 may serve as an insulation layer between the touch electrodes 161 and the touch electrodes 162. However, the disclosure is not limited thereto. According to other embodiments, other film layers may also serve as the insulation layer between the two types of touch electrodes 161 and 162, which is described below with reference to FIG. 13A to FIG. 13F and FIG. 14.

FIG. 13A to FIG. 13F are schematic partial top views of a part of a manufacturing process of an opposite substrate according to a seventh embodiment of the disclosure. FIG. 14 is a schematic cross-sectional view of FIG. 13F along a section line VI-VI'.

Figure 13A:
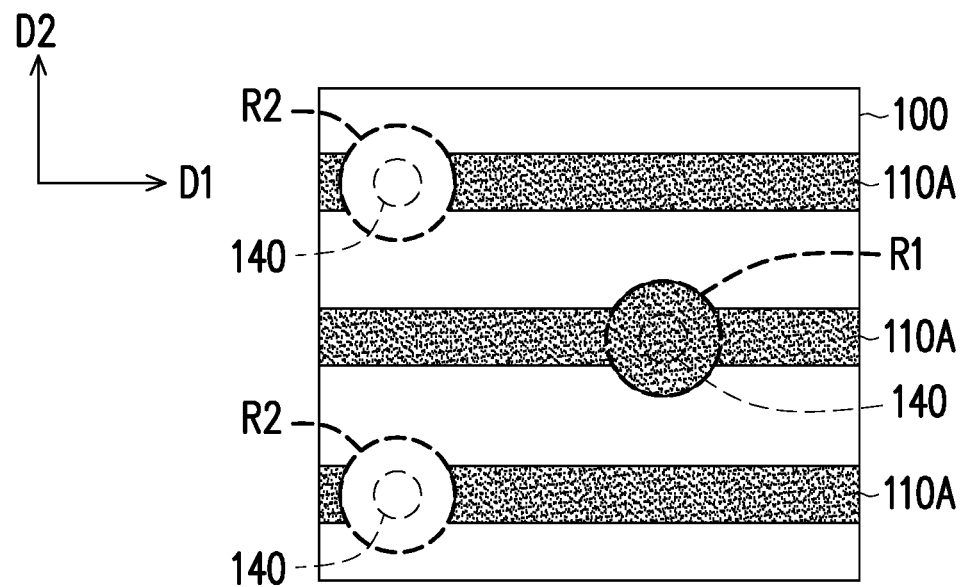
FIG. 13A to FIG. 13F are schematic partial top views of a part of a manufacturing process of an opposite substrate according to a seventh embodiment of the disclosure.
Figure 14:
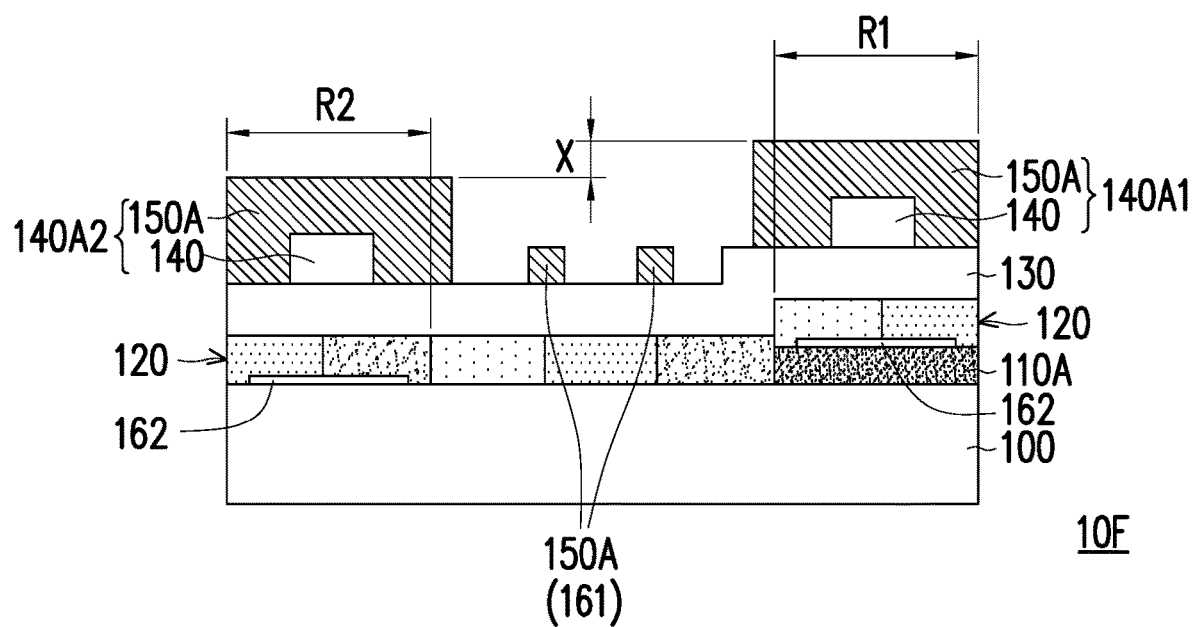
FIG. 14 is a schematic cross-sectional view of FIG. 13F along a section line VI-VI'.

It should be noted that in order to clearly show a relative configuration relationship between the first light-shielding patterns 110A and the support members 140, configuration positions of the support members 140 are indicated by thin dotted lines in FIG. 13A, but the support members 140 are not yet formed on the substrate 100 in the step of FIG. 13A.

The manufacturing process of an opposite substrate 10F of the seventh embodiment is similar to the manufacturing process of the opposite substrate 10A of the second embodiment, and a main difference there between is that the manufacturing process of the opposite substrate 10F further includes: forming a plurality of touch electrodes 162 on the first light-shielding patterns 110, which is specifically described below with reference to FIG. 13A to FIG. 13F and FIG. 14.

Figure 13B:
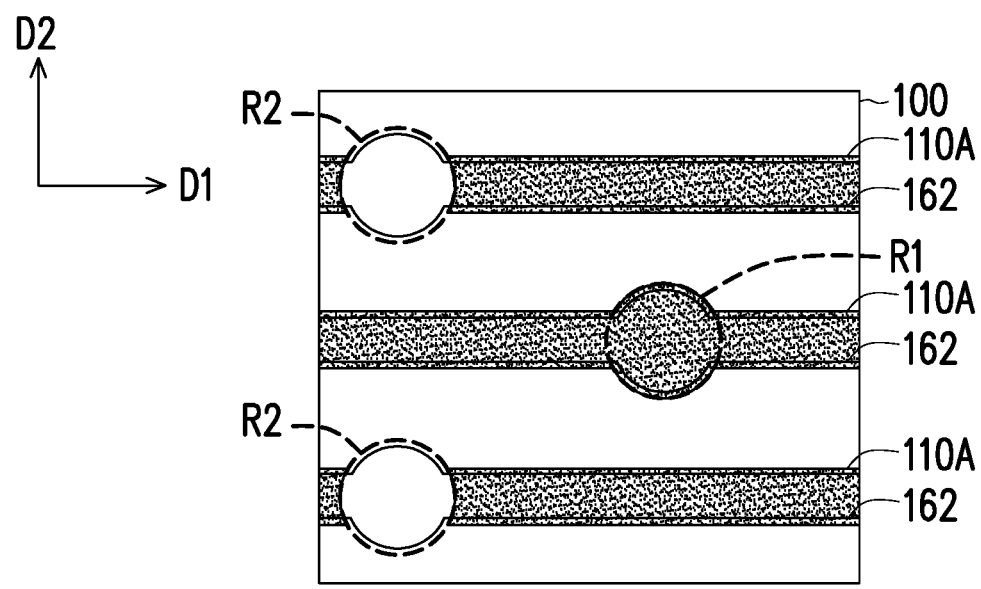
Figure 13C:
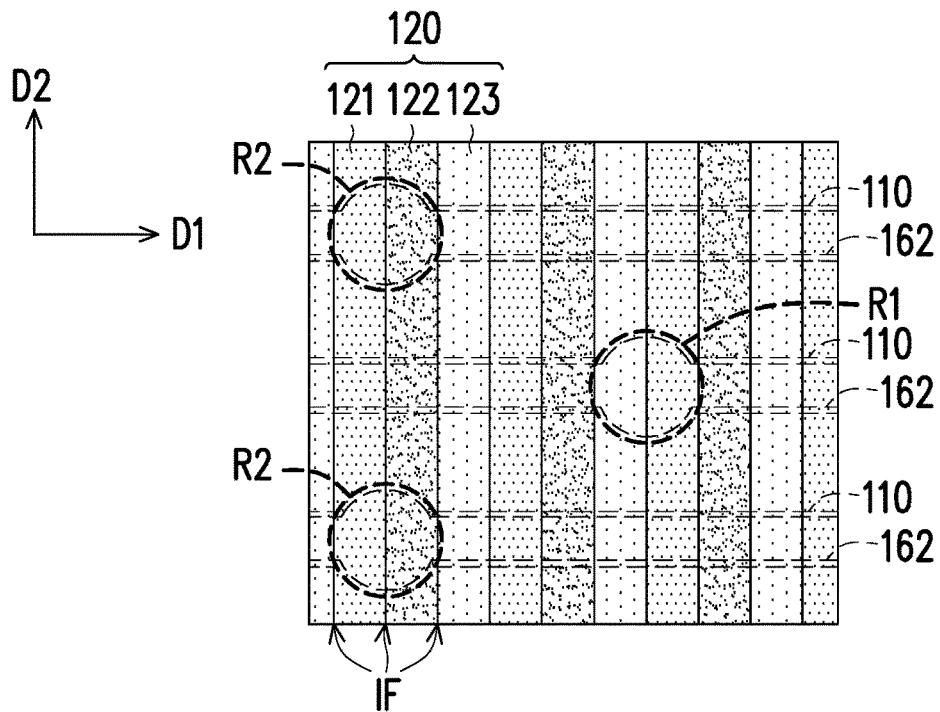
Figure 13D:
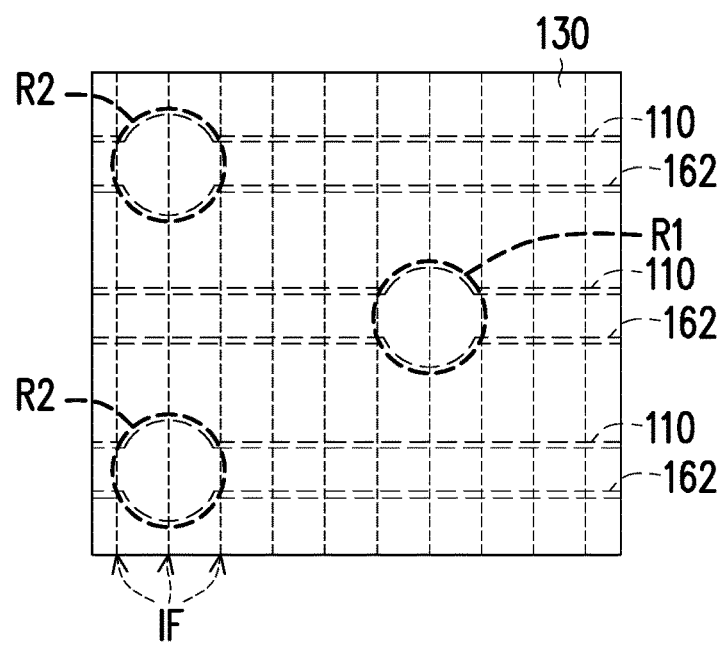
Figure 13E:
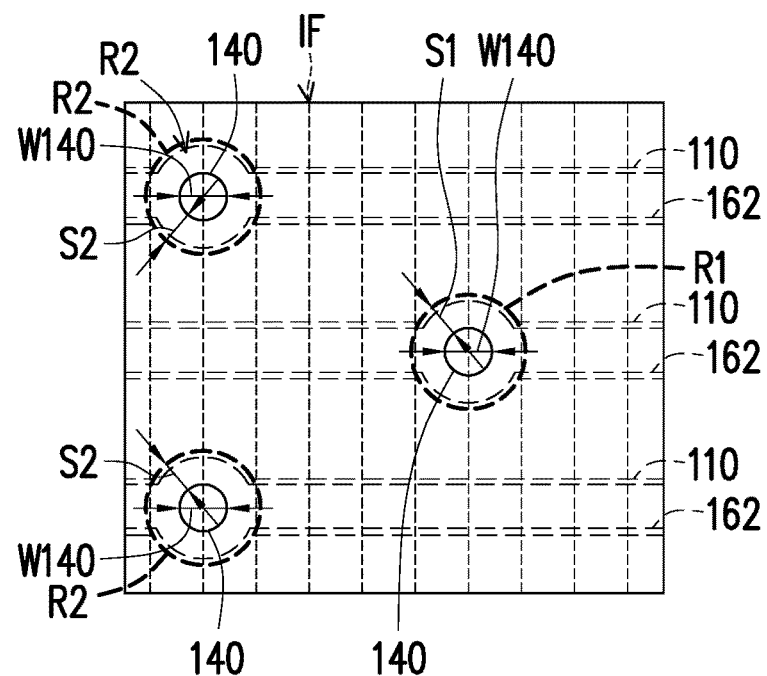
Figure 13F:
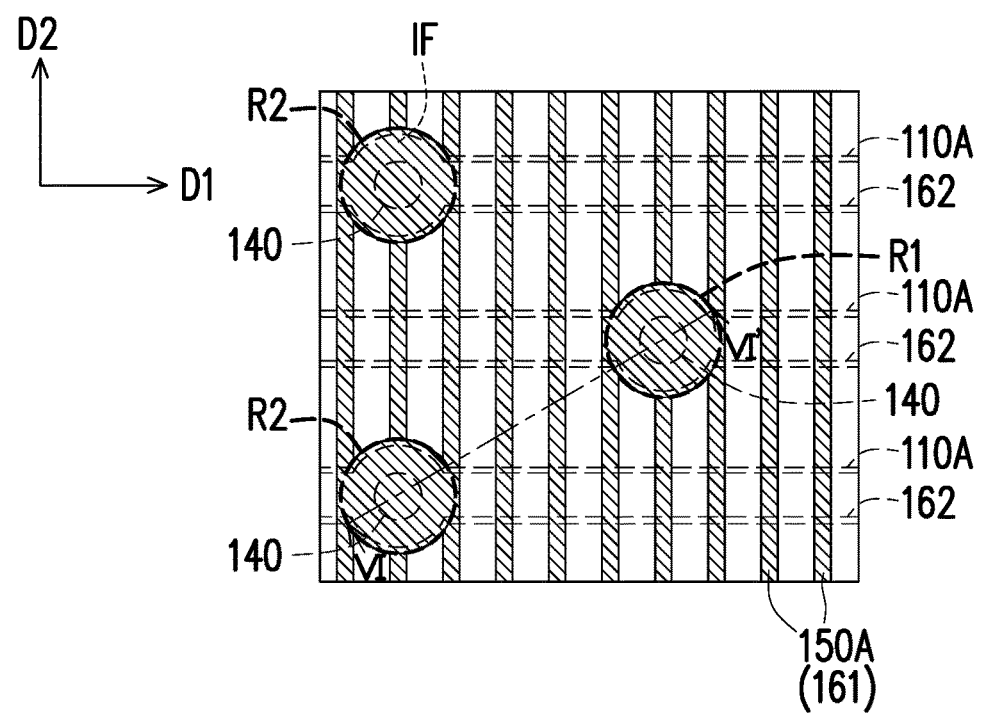

With reference to FIG. 13A to FIG. 13F and FIG. 14, the manufacturing process of the opposite substrate 10F sequentially includes: forming the first light-shielding patterns 110A (FIG. 13A), forming the touch electrodes 162 (FIG. 13B), forming the color filter pattern layer 120 (FIG. 13C), forming the planarization layer 130 (FIG. 13D), forming the support members 140 (FIG. 13E) and forming the second light-shielding patterns 150A (FIG. 13F).

According to the above manufacturing process, as shown in FIG. 14, the first light-shielding patterns 110A are located between the touch electrodes 162 and the substrate 100. The touch electrodes 162 are located between the planarization layer 130 and the first light-shielding patterns 110A. The planarization layer 130 is located between the support members 140 and the touch electrodes 162. The support members 140 are located between the second light-shielding patterns 150A and the planarization layer 130.

In the embodiment, the opposite substrate 10F may also selectively include the color filter pattern layer 120, and the color filter pattern layer 120 may be selectively located between the touch electrodes 162 and the planarization layer 130. However, the disclosure is not limited thereto. According to other embodiments, the color filter pattern layer 120 may also be disposed at other appropriate positions. For example, in another embodiment, the touch electrode 162 may also be formed on the color filter pattern layer 120, and the color filter pattern layer 120 may also be located between the touch electrodes 162 and the first light-shielding patterns 110.

With reference to FIG. 13B, FIG. 13F and FIG. 14, it should be noted that in the embodiment, at least a part of the second light-shielding patterns 150A including metal may serve as a plurality of the touch electrodes 161, where the touch electrodes 161 are intersected with the touch electrodes 162. The touch electrodes 161 and the touch electrodes 162 may construct touch sensing elements. For example, one of the touch electrode 161 and the touch electrode 162 may serve as a transmission pattern (Tx), and the other one of the touch electrode 161 and the touch electrode 162 may serve as a reception pattern (Rx). In this way, the opposite substrate 10E further has a touch function in addition to the advantages of the aforementioned opposite substrate 10A.

In the embodiment, the planarization layer 130 and/or the color filter pattern layer 120 are located between the touch electrodes 161 and the touch electrodes 162 that are intersected with each other, and the planarization layer 130 and/or the color filter pattern layer 120 may serve as an insulation layer between the touch electrodes 161 and the touch electrodes 162.

The aforementioned touch electrode 162 may also be disposed on the substrate 100 of other embodiments (for example, the opposite substrate 10 of the first embodiment, the opposite substrate 10B of the third embodiment, or the opposite substrate 10D of the fifth embodiment) to enable the touch function. Those with ordinary knowledge in the art should be able to realize it according to the above description, and all kinds of the opposite substrates formed in this way are also within a protection scope of the disclosure.

Figure 15:
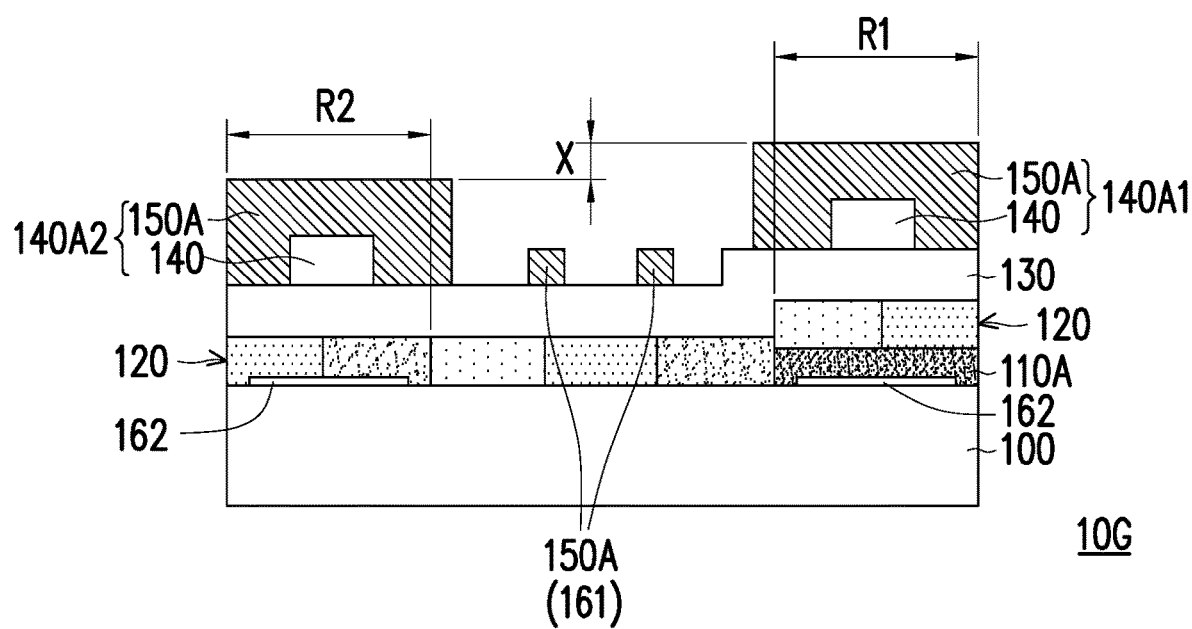
FIG. 15 is a schematic cross-sectional view of an opposite substrate according to an eighth embodiment of the disclosure.

FIG. 15 is a schematic cross-sectional view of an opposite substrate according to an eighth embodiment of the disclosure. An opposite substrate 10G of FIG. 15 is similar to the opposite substrate 10F of FIG. 14, and a difference there between is that in the manufacturing process of the opposite substrate 10G of FIG. 15, the touch electrodes 162 are formed first, and then the first light-shielding patterns 110A are formed. According to the above manufacturing process, the touch electrodes 162 are formed on the substrate 100, and the first light-shielding patterns 110A are formed on the touch electrodes 162.

In summary, in one or more embodiments of the disclosure, the second light-shielding patterns in the opposite substrate serve to shield components (such as the data lines of the active device array substrate in the display) in the display which are not intended to be seen by users, and the first light-shielding patterns and the second light-shielding patterns extending in different directions are formed on the substrate in batches and are intersected with each other. Therefore, in comparison with shielding light by only stacking color resists, the opposite substrate provided in one or more embodiments of the disclosure has better light-shielding ability and is adapted to mitigate the problem of light mixture. In addition, the opposite substrate provided in one or more embodiments of the disclosure is adapted to avoid a problem of insufficient aperture ratio caused by exposure at an edge corner of a photomask. Moreover, when the first light-shielding patterns and the second light-shielding patterns are located on the same side of the planarization layer, one of the first light-shielding pattern, the second light-shielding pattern, and the planarization layer may serve to provide the height differences between the primary support regions and the secondary support regions. As such, the support members located on the primary support regions and the secondary support regions may be the support members with the same thickness. Moreover, when the first light-shielding patterns and the second light-shielding patterns are located on the opposite sides of the planarization layer, the openings of the planarization layer in the secondary support regions may lead to the height differences between the primary support regions and the secondary support regions. As such, the support members located on the primary support regions and the secondary support regions may also be the support members with the same thickness.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An opposite substrate adapted to a display and comprising:
   a substrate;
   a plurality of first light-shielding patterns located on the substrate, wherein the first light-shielding patterns respectively extend along a first direction, and a material of the first light-shielding patterns comprises an organic material;
   a plurality of second light-shielding patterns located on the substrate and intersected with the first light-shielding patterns, wherein the second light-shielding patterns respectively extend along a second direction, and a material of the second light-shielding patterns comprises metal;
   a planarization layer overlapped with the first light-shielding patterns and the second light-shielding patterns, wherein the first light-shielding patterns and the second light-shielding patterns are respectively located at opposite sides of the planarization layer or located at a same side of the planarization layer; and
   a plurality of support members located in a plurality of primary support regions and a plurality of secondary support regions of the opposite substrate, wherein when the first light-shielding patterns and the second light-shielding patterns are located at the same side of the planarization layer, the planarization layer has a plurality of openings respectively overlapped with the support members located in the secondary support regions.

2. The opposite substrate according to claim 1, wherein the support members have a same thickness.

3. The opposite substrate according to claim 1, wherein the metal is low reflective metal.

4. The opposite substrate according to claim 1, wherein the first light-shielding patterns are disposed corresponding to a plurality of scan lines in an active device array substrate of the display, and the second light-shielding patterns are disposed corresponding to a plurality of data lines in the active device array substrate.

5. The opposite substrate according to claim 1, wherein the first light-shielding patterns are located between the planarization layer and the substrate, the planarization layer is located between the support members and the first light-shielding patterns, and the support members are located between the second light-shielding patterns and the planarization layer.

6. The opposite substrate according to claim 5, wherein the first light-shielding patterns are overlapped with the support members located in the primary support regions and the secondary support regions, the second light-shielding patterns are overlapped with the support members located in the primary support regions, and the second light-shielding patterns are located outside the support members located in the secondary support regions.

7. The opposite substrate according to claim 5, wherein the second light-shielding patterns are overlapped with the support members located in the primary support regions and the secondary support regions, the first light-shielding patterns are overlapped with the support members located in the primary support regions, and the first light-shielding patterns are located outside the support members located in the secondary support regions.

8. The opposite substrate according to claim 5, wherein the first light-shielding patterns are overlapped with the support members located in the primary support regions and the secondary support regions, the planarization layer has the openings respectively overlapped with the support members located in the secondary support regions, and the second light-shielding patterns are located outside the support members located in the primary support regions and the secondary support regions.

9. The opposite substrate according to claim 1, wherein the second light-shielding patterns are located between the first light-shielding patterns and the substrate, the first light-shielding patterns are located between the planarization layer and the second light-shielding patterns, and the planarization layer is located between the support members and the first light-shielding patterns.

10. The opposite substrate according to claim 9, wherein the second light-shielding patterns are overlapped with the support members located in the primary support regions and the secondary support regions, and the first light-shielding patterns are overlapped with the support members located in the primary support regions and the secondary support regions.

11. The opposite substrate according to claim 9, wherein the second light-shielding patterns are located outside the support members located in the primary support regions and the secondary support regions, and the first light-shielding patterns are overlapped with the support members located in the primary support regions and the secondary support regions.

12. The opposite substrate according to claim 1, further comprising:
 a color filter pattern layer located between the first light-shielding patterns and the planarization layer, wherein when the planarization layer has the openings respectively overlapped with the support members located in the secondary support regions, the support members located in the secondary support regions are disposed on the color filter pattern layer overlapped with the openings.

13. The opposite substrate according to claim 1, further comprising:
 a plurality of touch electrodes disposed on the first light-shielding patterns, wherein the touch electrodes are intersected with the second light-shielding patterns.

14. The opposite substrate according to claim 13, wherein the first light-shielding patterns are disposed between the touch electrodes and the second light-shielding patterns.

15. The opposite substrate according to claim 13, wherein the planarization layer is disposed between the touch electrodes and the second light-shielding patterns.

* * * * *